United States Patent
Sato et al.

(10) Patent No.: US 7,727,873 B2
(45) Date of Patent: Jun. 1, 2010

(54) PRODUCTION METHOD OF GALLIUM NITRIDE-BASED COMPOUND SEMICONDUCTOR MULTILAYER STRUCTURE

(75) Inventors: Hisao Sato, Ichihara (JP); Hitoshi Takeda, Ichihara (JP)

(73) Assignee: Showa Denko K.K., Toyko (JP)

( * ) Notice: Subject to any disclaimer, the term of this patent is extended or adjusted under 35 U.S.C. 154(b) by 473 days.

(21) Appl. No.: 11/493,542

(22) Filed: Jul. 27, 2006

(65) Prior Publication Data

US 2007/0026551 A1 Feb. 1, 2007

Related U.S. Application Data

(60) Provisional application No. 60/706,016, filed on Aug. 8, 2005, provisional application No. 60/741,459, filed on Dec. 2, 2005.

(30) Foreign Application Priority Data

Jul. 29, 2005 (JP) .............................. 2005-220839
Nov. 24, 2005 (JP) .............................. 2005-339246

(51) Int. Cl.
H01L 21/28 (2006.01)
(52) U.S. Cl. ............................... 438/604; 257/E21.527
(58) Field of Classification Search ................. 438/604; 257/E21.527
See application file for complete search history.

(56) References Cited

U.S. PATENT DOCUMENTS

2002/0004252 A1* 1/2002 Watanabe et al. ............. 438/29
2003/0160229 A1   8/2003 Narayan et al.

FOREIGN PATENT DOCUMENTS

JP            3660446        3/2005

* cited by examiner

Primary Examiner—Thao X Le
Assistant Examiner—Elias Ullah
(74) Attorney, Agent, or Firm—Sughrue Mion, PLLC

(57) ABSTRACT

An object of the present invention is to provide a method for producing a gallium nitride-based compound semiconductor multilayer structure useful for the production of a gallium nitride-based compound semiconductor light-emitting device which can ensure that the operating voltage is reduced, the light emission output is good and the light emission output is less changed due to aging.

The inventive production method of a gallium nitride-based compound semiconductor multilayer structure comprises a substrate having thereon an n-type semiconductor layer, a light-emitting layer and a p-type semiconductor layer, the light-emitting layer being disposed between the n-type semiconductor layer and the p-type semiconductor layer, and the light-emitting layer having a multiple quantum well structure formed by alternately stacking a well layer and a barrier layer, wherein at least one well layer has a non-uniform thickness, at least a part of the barrier layer is grown at a higher temperature than the well layer, and the temperature difference between each growth temperature of the well layer, the barrier layer and the p-type semiconductor layer is adjusted to be in a specific range.

27 Claims, 15 Drawing Sheets

| WELL LAYER | MAXIMUM THICKNESS | MINIMUM THICKNESS |
|---|---|---|
| 1 | 3.0 | 2.8 |
| 2 | 3.1 | 2.5 |
| 3 | 3.1 | 2.5 |
| 4 | 3.1 | 2.2 |
| 5 | 3.0 | 2.3 |

(nm)

| WELL LAYER | MAXIMUM THICKNESS | MINIMUM THICKNESS |
|---|---|---|
| 1 | 3.0 | 2.9 |
| 2 | 3.1 | 2.2 |
| 3 | 2.8 | 2.1 |
| 4 | 3.1 | 2.2 |
| 5 | 3.2 | 2.1 |

(nm)

| WELL LAYER | MAXIMUM THICKNESS | MINIMUM THICKNESS |
|---|---|---|
| 1 | 3.0 | 2.8 |
| 2 | 3.1 | 2.5 |
| 3 | 3.0 | 1.9 |
| 4 | 2.8 | 2.2 |
| 5 | 3.0 | 2.0 |

(nm)

↑ SURFACE SIDE

WELL LAYER-1
WELL LAYER-2
WELL LAYER-3
WELL LAYER-4
WELL LAYER-5

↓ SUBSTRATE SIDE    PART 4

(nm)

| WELL LAYER | MAXIMUM THICKNESS | MINIMUM THICKNESS |
|---|---|---|
| 1 | 3.0 | 2.8 |
| 2 | 3.2 | 1.8 |
| 3 | 3.0 | 2.5 |
| 4 | 2.8 | 2.3 |
| 5 | 3.0 | 1.7 |

| WELL LAYER | MAXIMUM THICKNESS | MINIMUM THICKNESS |
|---|---|---|
| 1 | 3.0 | 2.8 |
| 2 | 3.2 | 2.5 |
| 3 | 3.1 | 1.9 |
| 4 | 3.0 | 2.2 |
| 5 | 2.9 | 1.9 |

(nm)

PART 7

| WELL LAYER | MAXIMUM THICKNESS | MINIMUM THICKNESS |
|---|---|---|
| 1 | 3.1 | 2.9 |
| 2 | 2.8 | 1.9 |
| 3 | 2.9 | 2.5 |
| 4 | 2.9 | 2.2 |
| 5 | 3.2 | 2.5 |

(nm)

| WELL LAYER | MAXIMUM THICKNESS | MINIMUM THICKNESS |
|---|---|---|
| 1 | 3.1 | 2.9 |
| 2 | 3.1 | 2.0 |
| 3 | 3.1 | 1.9 |
| 4 | 3.0 | 2.1 |
| 5 | 3.1 | 2.0 |

PRODUCTION METHOD OF GALLIUM NITRIDE-BASED COMPOUND SEMICONDUCTOR MULTILAYER STRUCTURE

CROSS REFERENCE TO RELATED APPLICATION

This application is an application filed under 35 U.S.C. §111(a) claiming benefit, pursuant to 35 U.S.C. §119(e)(1), of the filing date of Provisional Application No. 60/706,016 filed on Aug. 8, 2005 and of Provisional Application No. 60/741,459 filed on Dec. 2, 2005, pursuant to 35 U.S.C. §111(b).

TECHNICAL FIELD

The present invention relates to a production method of a gallium nitride-based compound semiconductor multilayer structure useful for producing a high-power light-emitting device which emits ultraviolet to blue light or green light.

BACKGROUND ART

In recent years, gallium nitride-based compound semiconductors have become of interest as materials for producing a light-emitting device which emits light of a short wavelength. Generally, a gallium nitride-based compound semiconductor is grown on a substrate made of an oxide crystal such as a sapphire single crystal, a silicon carbide single crystal, or a Group III-V compound single crystal, through a method such as metal-organic chemical vapor deposition (MOCVD), molecular-beam epitaxy (MBE), or hydride vapor phase epitaxy (HVPE).

At present, the crystal growth method that is most widely employed in the industry includes growing a semiconductor crystal on a substrate such as sapphire, SiC, GaN, or AlN, through metal-organic chemical vapor deposition (MOCVD). Specifically, an n-type semiconductor layer, a light-emitting layer, and a p-type semiconductor layer are grown on the aforementioned substrate, in a reactor tube, by use of a Group III organometallic compound and a Group V source gas and at a temperature of about 700° C. to about 1,200° C. After the growth of the above layers, a negative electrode is formed on the substrate or the n-type semiconductor layer, and a positive electrode is formed on the p-type semiconductor layer, whereby a light-emitting device is fabricated.

Conventionally, such a light-emitting layer is formed from InGaN whose composition is controlled so as to adjust the light emission wavelength. The active layer is sandwiched by layers having a bandgap higher than that of InGaN, thereby forming a double-hetero structure, or is incorporated into a multiple quantum well structure on the basis of the quantum well effect.

In a gallium nitride-based compound semiconductor light-emitting device having a light-emitting layer of a multiple quantum well structure, when the thickness of a well layer is adjusted to 2 to 3 nm, satisfactory output is attained, but a problematically high operating voltage is required. In contrast, when the thickness of the well layer is 2 nm or less, the operating voltage is lowered, but the satisfactory output, i.e., high-efficiency light emission, cannot be attained.

U.S. Patent Application Publication US2003/0160229A1 has proposed a gallium nitride-based compound semiconductor light-emitting device comprising a light-emitting layer having a multiple quantum well structure, where a thickness variation is imparted to the active well layer so as to obtain high-efficiency light emission.

Also, Japanese Patent No. 3,660,446 discloses a nitride semiconductor light-emitting device having a quantum well structure where the well layer has a non-uniform thickness. According to this patent publication, in the active layer of the quantum well structure, a very thin nitride semiconductor layer or a metal layer, having in-plane thickness distribution and in-plane crystallinity distribution, is provided below a well layer and the well layer is grown thereon, whereby the well layer is selectively grown, the active layer becomes a quantum dot, the light emission efficiency is greatly enhanced, and a highly reliable nitride semiconductor device can be realized. Furthermore, in this patent publication, the device reliability is enhanced by varying the thickness of the layer stacked below the well layer to change the film quality of the well layer.

However, studies by the present inventors have revealed that in a gallium nitride-based compound semiconductor light-emitting device comprising a light-emitting layer having a multiple quantum well structure, when the thickness of the well layer is made non-uniform, the light emission intensity disadvantageously deteriorates due to aging.

SUMMARY OF THE INVENTION

An object of the present invention is to provide a method for producing a gallium nitride-based compound semiconductor multilayer structure useful for the production of a gallium nitride-based compound semiconductor light-emitting device in which the operating voltage is reduced, the light emission output is good and the light emission output is hardly changed due to aging.

The present invention provides the following inventions.

(1) A method for producing a gallium nitride-based compound semiconductor multilayer structure comprising a substrate having thereon an n-type semiconductor layer, a light-emitting layer and a p-type semiconductor layer, the light-emitting layer being disposed between the n-type semiconductor layer and the p-type semiconductor layer, and the light-emitting layer having a multiple quantum well structure formed by alternately stacking a well layer and a barrier layer, wherein at least one well layer has a non-uniform thickness, at least a part of the barrier layer is grown at a higher temperature than the well layer, and the temperature difference (T3−T1) between the growth temperature (T3) of the p-type semiconductor layer and the growth temperature (T1) of the well layer is adjusted to be in a range from 240 to 280° C.

(2) A method for producing a gallium nitride-based compound semiconductor multilayer structure comprising a substrate having thereon an n-type semiconductor layer, a light-emitting layer and a p-type semiconductor layer, the light-emitting layer being disposed between the n-type semiconductor layer and the p-type semiconductor layer, and the light-emitting layer having a multiple quantum well structure formed by alternately stacking a well layer and a barrier layer, wherein at least one well layer has a non-uniform thickness, at least a part of the barrier layer is grown at a higher temperature than the well layer, and the temperature difference (T3−T2) between the growth temperature (T3) of the p-type semiconductor layer and the maximum growth temperature (T2) of the barrier layer is adjusted to be in a range from 40 to 90° C.

(3) A method for producing a gallium nitride-based compound semiconductor multilayer structure comprising a substrate having thereon an n-type semiconductor layer, a light-emitting layer and a p-type semiconductor layer, the light-emitting layer being disposed between the n-type semiconductor layer and the p-type semiconductor layer, and the light-emitting layer having a multiple quantum well structure formed by alternately stacking a well layer and a barrier layer, wherein at least one well layer has a non-uniform thickness, at least a part of the barrier layer is grown at a higher temperature than the well layer, and the temperature difference (T2−T1) between the maximum growth temperature (T2) of the barrier layer and the growth temperature (T1) of the well layer is adjusted to be in a range from 160 to 200° C.

(4) A method for producing a gallium nitride-based compound semiconductor multilayer structure comprising a substrate having thereon an n-type semiconductor layer, a light-emitting layer and a p-type semiconductor layer, the light-emitting layer being disposed between the n-type semiconductor layer and the p-type semiconductor layer, and the light-emitting layer having a multiple quantum well structure formed by alternately stacking a well layer and a barrier layer, wherein at least one well layer has a non-uniform thickness and the barrier layer is grown at a growth rate of less than 10 Å/min.

(5) The method for producing a gallium nitride-based compound semiconductor multilayer structure according to 1 or 2 above, wherein the temperature difference (T2−T1) between the maximum growth temperature (T2) of the barrier layer and the growth temperature (T1) of the well layer is further adjusted to be in a range from 160 to 200° C.

(6) The method for producing a gallium nitride-based compound semiconductor multilayer structure according to 1 above, wherein the temperature difference (T3−T2) between the growth temperature (T3) of the p-type semiconductor layer and the maximum growth temperature (T2) of the barrier layer is further adjusted to be in a range from 40 to 90° C.

(7) The method for producing a gallium nitride-based compound semiconductor multilayer structure according to 6 above, wherein the temperature difference (T2−T1) between the maximum growth temperature (T2) of the barrier layer and the growth temperature (T1) of the well layer is further adjusted to be in a range from 160 to 200° C.

(8) The method for producing a gallium nitride-based compound semiconductor multilayer structure according to any one of 1 to 7 above, wherein the growth temperature (T3) of the p-type semiconductor layer is adjusted to be in a range from 900 to 1,050° C.

(9) The method for producing a gallium nitride-based compound semiconductor multilayer structure according to any one of 1 to 8 above, wherein the growth of the barrier layer is performed at a plurality of growth temperatures.

(10) The method for producing a gallium nitride-based compound semiconductor multilayer structure according to any one of 1 to 9 above, wherein the well layer closest to the p-type semiconductor layer has a uniform thickness.

(11) The method for producing a gallium nitride-based compound semiconductor multilayer structure according to any one of 1 to 10 above, wherein the well layer closest to the n-type semiconductor layer has a uniform thickness.

(12) The method for producing a gallium nitride-based compound semiconductor multilayer structure according to any one of 1 to 11 above, wherein the thickness of a well layer having a uniform thickness is 1.8 to 5 nm.

(13) The method for producing a gallium nitride-based compound semiconductor multilayer structure according to any one of 1 to 12 above, wherein the thickness of a thin part of a well layer having a non-uniform thickness is not more than 2.7 nm.

(14) The method for producing a gallium nitride-based compound semiconductor multilayer structure according to any one of 1 to 13 above, wherein the multiple quantum well structure comprises 3 to 10 stacks of the well layer and the barrier layer.

(15) The method for producing a gallium nitride-based compound semiconductor multilayer structure according to any one of 1 to 14 above, wherein the barrier layer is a gallium nitride-based compound semiconductor selected from GaN, AlGaN and InGaN having a smaller In percentage than the InGaN forming the well layer.

(16) The method for producing a gallium nitride-based compound semiconductor multilayer structure according to 15 above, wherein the barrier layer is GaN.

(17) The method for producing a gallium nitride-based compound semiconductor multilayer structure according to any one of 1 to 16 above, wherein the barrier layer contains a dopant.

(18) The method for producing a gallium nitride-based compound semiconductor multilayer structure according to 17 above, wherein the dopant is at least one selected from the group consisting of C, Si, Ge, Sn, Pb, O, S, Se, Te, Po, Be, Mg, Ca, Sr, Ba and Ra.

(19) The method for producing a gallium nitride-based compound semiconductor multilayer structure according to 17 or 18 above, wherein the concentration of the dopant is from $1 \times 10^{17}$ to $1 \times 10^{18}$ cm$^{-3}$.

(20) The method for producing a gallium nitride-based compound semiconductor multilayer structure according to any one of 1 to 19 above, wherein the thickness of the barrier layer is from 7 to 50 nm.

(21) The method for producing a gallium nitride-based compound semiconductor multilayer structure according to 20 above, wherein the thickness of the barrier layer is at least 14 nm.

(22) The method for producing a gallium nitride-based compound semiconductor multilayer structure according to any one of 1 to 21 above, wherein the well layer comprises In.

(23) The method for producing a gallium nitride-based compound semiconductor multilayer structure according to 22 above, wherein a thin layer containing no In is provided on at least the substrate side of the barrier layer.

(24) The method for producing a gallium nitride-based compound semiconductor multilayer structure according to any one of 1 to 23 above wherein, after a well layer is formed, the layer thus formed is partly decomposed or sublimated to provide a non-uniform thickness.

(25) The method for producing a gallium nitride-based compound semiconductor multilayer structure according to 24 above, wherein the substrate temperature during decomposing or sublimating a part of the well layer is not lower than the substrate temperature during the forming of the well layer.

(26) The method for producing a gallium nitride-based compound semiconductor multilayer structure according to 24 or 25 above, wherein the decomposition or sublimation of a part of the well layer is conducted in an atmosphere containing a nitrogen source and containing no group III metal source.

(27) The method for producing a gallium nitride-based compound semiconductor multilayer structure according to any one of 24 to 26 above, wherein the decomposition or sublimation of a part of the well layer is conducted during the forming of the barrier layer.

(28) A gallium nitride-based compound semiconductor multilayer structure produced by the production method according to any one of 1 to 27 above.

(29) A gallium nitride-based compound semiconductor light-emitting device fabricated by providing a negative electrode and a positive electrode on the n-type semiconductor layer and the p-type semiconductor layer of the gallium nitride-based compound semiconductor multilayer structure according to 28 above, respectively.

(30) A lamp comprising the gallium nitride-based compound semiconductor light-emitting device according to 29 above.

(31) An electronic machine incorporating the lamp according to 30 above.

(32) A machine incorporating the electronic machine according to 31 above.

According to the present invention, during the production of a gallium nitride-based compound semiconductor light-emitting device comprising a light-emitting layer having a multiple quantum well structure containing at least one well layer having a non-uniform thickness, the differences between the respective growth temperatures of a well layer, a barrier layer and a p-type semiconductor layer are controlled to a specific range, and/or the growth rate of barrier layer is controlled to a specific range, whereby a gallium nitride-based compound semiconductor light-emitting device ensuring that the crystallinity of the semiconductor is excellent, the operating voltage is low, the light emission intensity is high, and the reduction rate of the light emission intensity due to aging is small, can be produced.

DETAILED DESCRIPTION OF THE INVENTION

Figure 1:
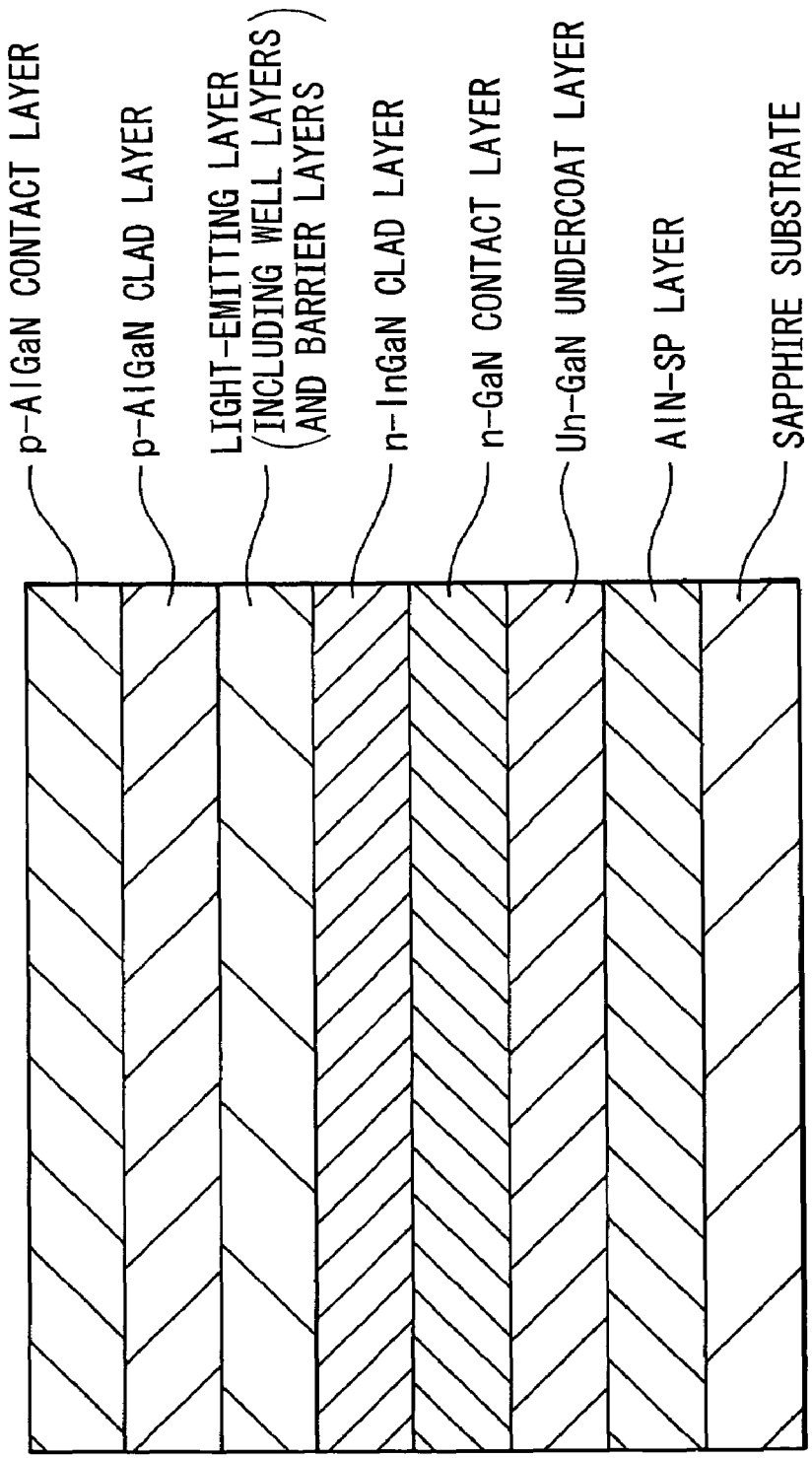
FIG. 1 is a schematic view of a cross-section of the gallium nitride-based compound semiconductor multilayer structure fabricated in the Example and the Comparative Example.

The n-type semiconductor layer, light-emitting layer, and p-type semiconductor layer of a gallium nitride-based compound semiconductor light-emitting device are widely known to be formed from a variety of gallium nitride-based compound semiconductors represented by formula: $Al_xIn_yGa_{1-x-y}N$ ($0 \leq x < 1$; $0 \leq y < 1$; $0 \leq x+y < 1$). No particular limitation is imposed on the gallium nitride-based compound semiconductor for forming the n-type semiconductor layer, the light-emitting layer, and the p-type semiconductor layer employed in the present invention, and a variety of gallium nitride-based compound semiconductors represented by formula: $Al_xIn_yGa_{1-x-y}N$ ($0 \leq x < 1$; $0 \leq y < 1$; $0 \leq x+y < 1$) may also be employed.

No particular limitation is imposed on the type of the substrate, and there may be employed conventionally known substrate species such as sapphire, SiC, GaP, GaAs, Si, ZnO, and GaN.

In order to form a gallium nitride-based compound semiconductor on any of the above substrates (excepting a GaN substrate) which are not theoretically lattice-matched with the gallium nitride-based compound, a low-temperature buffer method (disclosed in, for example, Japanese Patent 3026087 and Japanese Laid-Open Patent Application (kokai) No. 4-297023) and a lattice-mismatch crystal epitaxial growth technique (disclosed in, for example, Japanese Laid-Open Patent Application (kokai) No. 2003-243302), which is called a "seeding process (SP)," may be employed. Among these methods, from the viewpoint of productivity and other factors, the SP method is a particularly advantageous lattice-mismatch crystal epitaxial growth technique which can produce AlN crystal film at a high temperature that allows formation of GaN crystals.

When a lattice-mismatch crystal epitaxial growth technique such as a low-temperature buffer method or an SP method is employed, the gallium nitride-based compound semiconductor for an undercoat layer on which a semiconductor is formed is preferably GaN which is undoped or lightly doped (dopant concentration is about $5 \times 10^{17}$ cm$^{-3}$). The undercoat layer preferably has a thickness of 1 to 20 μm, more preferably 5 to 15 μm.

In the present invention, at least one well layer of the well layers included in a multiple quantum well structure for forming a light-emitting layer is a well layer having a non-uniform thickness. In the present invention, "uniform thickness" means that the thicknesses of all parts of a layer are included in the range of ±10%, preferably ±7%, with respect to the average thickness. "Non-uniform thickness" means that the thickness of at least a part of a layer is not in the range of ±10% of the average thickness. "Average thickness" is an arithmetic average of the maximum thickness and the minimum thickness of the layer. In a well layer having a non-uniform thickness, a part having a thickness larger than the average thickness is designated to "a thick part" and a part having a thickness smaller than the average thickness is designated to "a thin part".

Whether the thickness of each well layer is uniform or non-uniform is measured and determined by a cross-sectional TEM photograph of a gallium nitride-based compound semiconductor. For example, the variation in the thicknesses of each well layer can be measured by observing the cross-section in a TEM photograph at 200,000 to 2,000,000 magnifications. FIGS. 4 to 11 are cross-sectional TEM photographs of 1,000,000 magnifications of a chip produced according to Example 1. The thickness can be calculated based on the magnification. The maximum thickness and the minimum thickness of each well layer in each figure are described in the table attached to each figure. Whether the thickness of each well layer is uniform or non-uniform can be determined from the maximum thickness and the minimum thickness of each well layer calculated from the eight figures. A thick part has a thickness larger than the average thickness which is an arithmetic average of the maximum thickness and the minimum thickness, and a thin part has a thickness smaller than the average thickness. In the drawings, A represents a thick part and B represents a thin part. The maximum thickness and the minimum thickness of each well layer is calculated by observing plural parts of a cross-sectional TEM photograph at, for example, least eight points at a pitch of 20 μm.

When the thicknesses of all well layers in the multiple quantum well structure forming a light-emitting layer are non-uniform, in comparison with the case in which the thicknesses of all well layers are uniform, the operating voltage is lower and the light emission output is the same or lower. However, if the thicknesses of all well layers are not non-uniform and the thickness of a part of well layers is uniform, the operating voltage is decreased and the light emission output is increased. The reason for the above is not known. Particularly, when the thickness of the well layer closest to the p-type semiconductor layer or the n-type semiconductor layer is uniform, the light emission output is effectively increased. When the thicknesses of the well layer closest to the p-type semiconductor layer and of the well layer closest to the n-type semiconductor layer are uniform, the light emission output is effectively increased but the operating voltage is also increased. Therefore, well layers having uniform thicknesses can include the well layer closest to the p-type semiconductor layer and the well layer closest to the n-type semiconductor layer and, preferably includes one of them. It is particularly preferable to have the well layer closest to the p-type semiconductor layer as a well layer having a uniform thickness.

If the number of well layers having uniform thicknesses is increased, the operating voltage is increased. Accordingly, the number of well layers having uniform thicknesses is at least 1 and preferably not more than 60%, more preferably not more than 40%, of the total number of well layers.

The thickness of a well layer having a uniform thickness is preferably 1.8 to 5 nm. If the thickness is out of this range, the light emission output is decreased. The thickness is more preferably in the range of 2.0 to 3.5 nm.

The thickness of a thick part of a well layer having a non-uniform thickness is preferably about 1.8 to 5 nm. If the thickness of the thick part is out of this range, the light emission output is decreased. The thickness is more preferably in the range of 2.3 to 3.5 nm. The width of the thick part is preferably 10 to 5,000 nm, more preferably 20 to 1,000 nm.

The area of the thick part preferably accounts for 30 to 90% the entire area of the well layer. When the area falls within the range, a lowering of the operating voltage and an increase in the light emission output can be attained. More preferably, the area of the thick part accounts for 60 to 90% the entire area of the well layer. The area ratio of the thick part and that of the thin part can be calculated from the width as measured from a cross-section TEM photograph.

The thin part has a width of 1 to 200 nm, more preferably 5 to 150 nm.

The difference in thickness between the maximum thickness of the thick part and the minimum thickness of the thin part preferably falls within a range of about 1 to 3 nm. The thickness of the thin part preferably falls within a range of 1.0 to 2.7 nm.

The well layer may include a thin part having a thickness of 0. In other words, the well layer may include an area that is not covered with a well layer. However, such an area is preferably small in order to prevent lowering of light emission output. Thus, the area preferably accounts for 30% or less the entire area of the well layer, more preferably 20% or less, particularly preferably 10% or less. The area ratio can be calculated from the width as measured from a cross-section TEM photograph.

The well layer is preferably a gallium nitride-based compound semiconductor containing In because an In-containing gallium nitride-based compound semiconductor is a crystal system readily providing a structure having a thick part and a thin part by the method described later. Also, the In-containing gallium nitride-based compound semiconductor can emit light in the blue region at high intensity.

The barrier layer may be formed of, other than GaN or AlGaN, an InGaN layer having a smaller In percentage than the InGaN constituting the well layer. GaN is particularly suitable. In the present invention, it is preferable that at least a part of the barrier layer is grown at a substrate temperature higher than that at the growth of the well layer. By virtue of the presence of a barrier layer grown at a high temperature, the light-emitting device can be prevented from degradation in the reverse voltage characteristics due to aging.

The barrier layer may be grown through a plurality of steps differing in growth temperature. For example, after stacking a barrier layer A to a predetermined thickness at a growth temperature T4 on a well layer comprising a thick part and a thin part, a barrier layer B may be further stacked thereon by elevating the growth temperature to T2. Thereafter, a barrier layer C may be still further stacked by decreasing the growth temperature to T5. When a barrier layer C stacked at a lower temperature than T2 is present, an effect of suppressing degradation in the characteristics due to aging may be further imparted and this is more preferred. The growth temperature of the barrier layer C may be the same as the growth temperature of the barrier layer A or may be even the same as the growth temperature T1 of the well layer. If a barrier layer grown at a relatively low temperature is not present, damage sometimes occurs in the well layer and the light emission output may decrease.

It is preferable that the relationship between the temperature T1 at the growth of the well layer and the temperature T2 at the growth of the barrier layer B is T1<T2, and in the process of elevating the temperature from T1 to T2 after the growth of the well layer, when a step of stopping the supply of the Group III raw material while continuing the supply of the nitrogen-containing carrier gas and the nitrogen source is provided, a thick part and a thin part can be effectively formed in the well layer. At this time, change or the like of the carrier gas is not necessary. If the carrier gas is changed to hydrogen, the wavelength of light emission is shortened. The degree of change in the wavelength is difficult to stably control and therefore, the productivity of the product decreases.

The temperature rising rate from T1 to T2 is preferably on the order of 1 to 200° C./min, more preferably on the order of 5 to 150° C./min. The time spent for the temperature rising from T1 to T2 is preferably on the order of 30 seconds to 10 minutes, more preferably on the order of 1 to 5 minutes.

The barrier layer may comprise a stacked structure of plural layers in which each composition is different. When the well layer is a gallium nitride-based compound semiconductor containing In, it is preferable to provide a thin layer containing no In on at least one side of the barrier layer attached to the well layer of the substrate side. It is preferable that the decomposition and sublimation of In in the well layer can be inhibited, and that the emission wavelength can be stably controlled, by forming the thin layer. The thin layer is preferably provided at a substrate temperature the same as the growing temperature of the well layer.

When a dopant is doped into the barrier layer, the operating voltage is preferably decreased. As an element for the dopant, C, Si, Ge, Sn, Pb, O, S, Se, Te, Po, Be, Mg, Ca, Sr, Ba and Ra can be exemplified. Among those, Si and Ge are preferable and Si is the most preferable.

The concentration of the dopant is preferably $5\times10^{16}$ to $1\times10^{18}$ cm$^{-3}$. If the concentration is less than $5\times10^{16}$ cm$^{-3}$, the operating voltage is not effectively decreased. If the concentration is more than $1\times10^{18}$ cm$^{-3}$, the reverse voltage characteristics tend to be degraded. The concentration is more preferably $1\times10^{17}$ to $5\times10^{17}$ cm$^{-3}$.

The thickness of the barrier layer is preferably at least 7 nm, more preferably at least 14 nm. If the barrier layer is thin, the gap between the thicknesses of a thick part and a thin part of a well layer cannot be filled and, as a result, formation of the thick part and the thin part of the well layer is prohibited, leading to lowering the emission efficiency and degradation in characteristics due to aging. If the barrier layer is too thick, the operating voltage is increased and the emission efficiency is decreased. Therefore, the thickness of the barrier layer is preferably not more than 50 nm.

In the case where at least one well layer having a non-uniform thickness is present, the growth rate of barrier layer is important to prevent the light emission output of the light-emitting device from degradation due to aging. The growth rate of barrier layer is preferably less than 10 Å/min, more preferably it is 7 Å/min or less and most preferably it is 5 Å/min or less. When it is 10 Å/min or more, a barrier layer which is even and has a good crystallinity cannot be grown and the degradation, due to aging, of the light emission output is increased (that is, the percentage change in the light emission output is increased). When the growth rate of barrier layer is too low, productivity is lowered. Therefore, it is preferable that the growth rate of barrier layer is 1 Å/min or more. When the barrier layer is composed of a plurality of layers, it is sufficient that the average growth rate is the above value.

The repetition of stacking in the multiple quantum well structure is preferably about 3 to about 10 times, more preferably about 3 to about 6 times. The composition and structure can be changed in each well layer and barrier layer.

The p-type semiconductor layer generally has a thickness of 0.01 to 1 μm and is formed of a p-type clad layer which is in contact with the light-emitting layer and a p-type contact layer for forming a positive electrode. The p-type clad layer may also serve as the p-type contact layer. The p-type clad layer is formed from a semiconductor such as GaN or AlGaN and doped with Mg serving as a p-type dopant. In order to prevent an overflow of electrons, the p-type clad layer is preferably formed from a material having a bandgap greater than that of the material for forming the light-emitting layer. Furthermore, in order to effectively inject carriers into the light-emitting layer, the p-type clad layer preferably has high carrier concentration.

The p-type clad layer may be formed by alternatingly stacking layers repeatedly, each layer having a different specific composition and lattice constants. In this case, in addition to the composition, the amount of dopant, film thickness, etc. of the stacked layers may be modified.

The p-type contact layer may be formed from a semiconductor such as GaN, AlGaN, or InGaN, and is doped with Mg serving as an impurity element. When removed from a reactor, the as-removed Mg-doped gallium nitride-based compound semiconductor generally exhibits a high electric resistance. However, the Mg-doped compound semiconductor exhibits p-type conductivity through activation such as annealing, electron-beam irradiation, or microwave irradiation.

The p-type contact layer may be formed from boron phosphide doped with a p-type impurity element, which exhibits p-type conductivity even though the aforementioned treatment for attaining p-type conductivity is not performed.

The n-type semiconductor layer generally has a thickness of about 1 to about 10 μm, preferably about 2 to about 5 μm. The n-type semiconductor layer is formed of an n-type contact layer for forming a negative electrode and an n-type clad layer which has a bandgap larger than that of a light-emitting layer and which is in contact with the light-emitting layer. The n-type contact layer may also serve as the n-type clad layer. The n-type contact layer is preferably doped with Si or Ge at high concentration. The thus doped n-type semiconductor layer preferably has a carrier concentration which is controlled to about $5\times10^{18}$ cm$^{-3}$ to about $2\times10^{19}$ cm$^{-3}$.

The n-type clad layer may be formed from a semiconductor such as AlGaN, GaN, or InGaN. Needless to say, when InGaN is employed, the InGaN preferably has such a composition as to have a bandgap greater than that of the InGaN forming the light-emitting layer. The carrier concentration of the n-type clad layer may be equal to or greater or smaller than that of the n-type contact layer. The n-type clad layer preferably has a surface having high flatness by appropriately regulating growth conditions including growth rate, growth temperature, growth pressure, and dopant concentration, so as to attain high crystallinity of the light-emitting layer formed thereon.

The n-type clad layer may be formed by alternatingly stacking layers repeatedly, each layer having a different specific composition and lattice constants. In this case, in addition to the composition, the amount of dopant, film thickness, etc. of the layer stacked may be modified.

Although the growth temperature of the n-type layer is varied depending on the composition, it is preferably from 800 to 1200° C., generally. More preferably, it is from 1000 to 1200° C. In the case of the n-type clad layer which contains In, however, a temperature lower than one in the above range is preferable.

No particular limitation is imposed on the method for growing the gallium nitride-based compound semiconductor for forming the aforementioned n-type semiconductor layer, light-emitting layer, and p-type semiconductor layer, and any of widely known methods such as MBE, MOCVD, and HVPE may be employed under widely known conditions. Of these, MOCVD is preferred.

Regarding sources for forming the semiconductor, ammonia, hydrazine, an azide, or a similar compound may be used as a nitrogen source. Examples of the Group III organometallic compound include trimethylgallium (TMGa), triethylgallium (TEGa), trimethylindium (TMIn), and trimethylaluminum (TMAl). Examples of employable dopant sources include silane, disilane, germane, an organic germanium compound and biscyclopentadienylmagnesium ($Cp_2Mg$). Nitrogen or hydrogen may be employed as a carrier gas.

In the case where at least one well layer having a non-uniform thickness is present, it is important to control the differences between respective growth temperatures of a well layer, a barrier layer and a p-type semiconductor layer to a specific range at the time of growing these semiconductor layers. By controlling the differences between the respective growth temperatures, the light emission output of the light-emitting device can be prevented from degradation due to aging (that is, the percentage change in the light emission output can be reduced).

Figure 2:
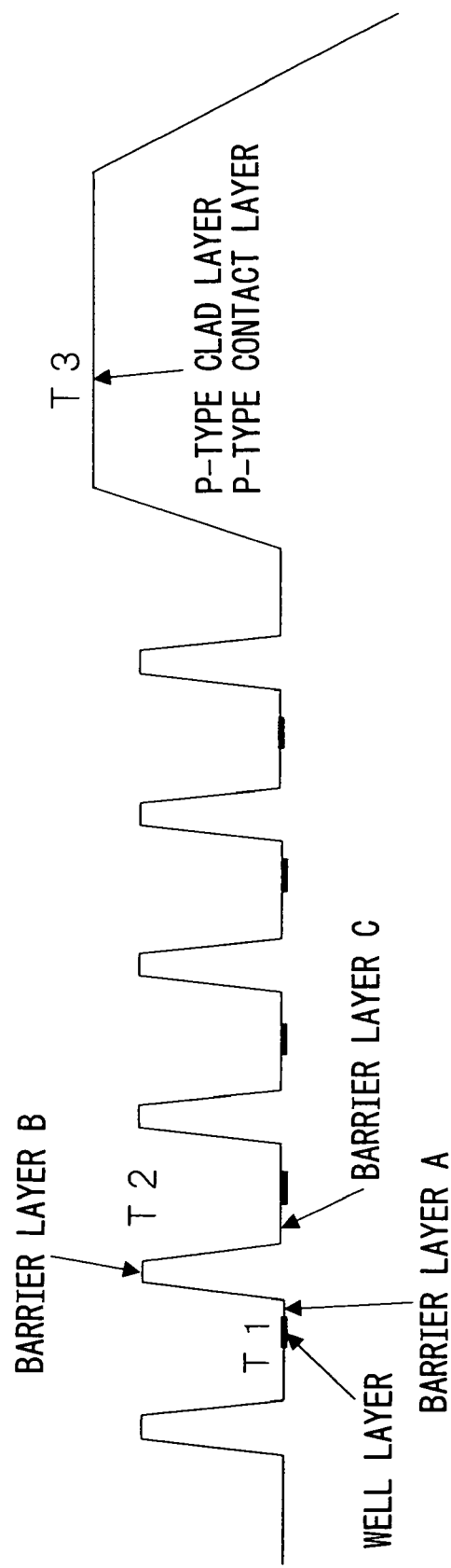
FIG. 2 is a view showing the growth temperature profile of the quantum well structure and the p-type semiconductor layer in Example 1.

FIG. 2 is a view showing the growth temperature profile of the quantum well structure and the p-type semiconductor layer in Example 1 as one example of the present invention. In this growth temperature profile, a barrier layer grown at a low temperature (hereinafter referred to as a "barrier layer A") subsequently to the well layer is stacked, a barrier layer grown while substantially keeping a high temperature (a barrier layer stacked at a maximum temperature, hereinafter referred to as a "barrier layer B") is stacked, and a barrier layer grown while substantially keeping a low temperature after the temperature drop (hereinafter referred to as a "barrier layer C") is stacked to produce a multiple quantum well structure. Furthermore, after the production of the multiple quantum-well structure, the substrate temperature is changed, and a p-type clad layer and a p-type contact layer are grown. In the present invention, the growth temperature of the well layer is defined as T1, the growth temperature of the barrier layer B grown substantially at a higher growth temperature than the well layer after stacking the well layer is defined as T2, and the growth temperature of the p-type semiconductor layer is defined as T3. The growth temperature of the p-type clad layer and the growth temperature of the p-type contact layer may be different and in this case, whichever temperature is higher is defined as T3.

T3−T1 is preferably from 240 to 280° C. If T3−T1 exceeds this range, the percentage change in the light emission output becomes large, whereas if T3−T1 is less than this range, the light emission output itself decreases. This temperature difference is more preferably from 240 to 270° C.

T3−T2 is preferably from 40 to 90° C. If T3−T2 is less than this range, the operating voltage is elevated, whereas if T3−T2 exceeds this range, the percentage change in the light emission output becomes large. This temperature difference is more preferably from 40 to 80° C.

T2−T1 is preferably from 160 to 200° C. If T2−T1 is less than this range, the percentage change in the light emission output becomes large, whereas if T2−T1 exceeds this temperature range, the operating voltage is elevated or the percentage change in the light emission output becomes large. This temperature difference is more preferably from 170 to 200° C.

The growth temperature T1 of the well layer is preferably from 600 to 850° C. If T1 is less than this range, the percentage change in the light emission output becomes large, whereas if it exceeds this range, the In composition of the InGaN well layer decreases and the light emission wavelength is shortened. This growth temperature is more preferably from 700 to 750° C.

The growth temperature T2 of the barrier layer B is preferably from 850 to 1,000° C. If T2 is less than this range, the percentage change in the light emission output becomes large, whereas if it exceeds this range, the operating voltage is elevated. This growth temperature is more preferably from 890 to 930° C.

The growth temperature T3 of the p-type semiconductor layer is preferably from 900 to 1,050° C. If T3 exceeds this range, the percentage change in the light emission output becomes large, whereas if it is less than this range, the light emission output decreases. This growth temperature is more preferably from 960 to 1,000° C.

A well layer having a non-uniform thickness is preferably formed by growing a well layer to a predetermined thickness and then decomposing or sublimating a part of the well layer. A gallium nitride-based compound semiconductor containing In can be easily decomposed or sublimated and is preferably used.

After an In-containing gallium nitride-based compound semiconductor is grown to a predetermined thickness at a substrate temperature of the above-described T1 while supplying an In-containing Group III metal source and a nitrogen source, the substrate temperature is kept as it is or elevated in the state of the supply of the Group III metal source being stopped, whereby a part of the grown compound semiconductor can be decomposed or sublimated. The carrier gas is preferably nitrogen. The decomposition or sublimation is preferably performed after or while elevating the substrate temperature from the above-described growth temperature to T2.

Negative electrodes of a variety of compositions and structures have been widely known, and no particular limitation is imposed on the negative electrode which may be employed in the present invention. Examples of employable contact materials for the negative electrode which is to be in contact with an n-type contact layer include Al, Ti, Ni, Au, Cr, W, and V. Needless to say, the negative electrode may have a multilayer structure in its entirety, thereby imparting the electrode with a bonding property and other properties.

Positive electrodes of a variety of compositions and structures have been widely known, and no particular limitation is imposed on the positive electrode which may be employed in the present invention.

Examples of light-permeable positive electrode materials include Pt, Pd, Au, Cr, Ni, Cu, and Co. Through partial oxidation of the positive electrode, light permeability is known to be enhanced. When a flip-chip-type light-emitting device is fabricated, examples of employable reflection-type positive electrode materials include the aforementioned materials, Rh, Ag, and Al.

The positive electrode may be formed through a method such as sputtering or vacuum vapor deposition. Particularly when sputtering is employed under appropriately controlled sputtering conditions, ohmic contact can be established even though the electrode film is not annealed after formation of the film, which is preferred.

The light-emitting device may have a flip-chip-type structure including a reflection-type positive electrode or a face-up-type structure including a light-permeable positive electrode or a lattice-like or comb-like positive electrode.

In a well layer of the present invention having a non-uniform thickness which includes a thick part and a thin part, an interface between the well layer and a barrier layer composed of a material different from that of the well layer in a boundary area between the thick part and the thin part is slanted to the substrate surface. Therefore, the amount of light extracted in the direction normal to the substrate surface increases. Particularly when the light-emitting device has a flip-chip-type structure including a reflection-type electrode, emission intensity is further enhanced.

A semiconductor light-emitting device is fabricated from the inventive gallium nitride compound semiconductor multilayer structure, and through conventional means well known in the art, a transparent cover was attached to the semiconductor light-emitting device, thereby fabricating a lamp. Also, a phosphor-containing cover was attached to the semiconductor light-emitting device, thereby fabricating a white light lamp.

A lamp having a low operating voltage and a high emission output may be fabricated from the inventive gallium nitride-based compound semiconductor light-emitting device. Therefore, an electronic machine such as a portable telephone, a display and an instrument panel, in which the lamp fabricated by the above-mentioned technique is incorporated, and machines such as a car, a computer and a game machine, in which the electronic machine is incorporated, may be operated with low electric power and may attain a high performance. Specially, apparatuses such as a portable telephone, a toy, a game machine and a car part, which are operated by a battery, may attain the effect of saving energy.

EXAMPLES

The present invention will next be described in more detail by way of examples, which should not be construed as limiting the invention.

Example 1

FIG. 1 schematically shows a gallium nitride-based compound semiconductor multilayer structure, for producing a semiconductor light-emitting device, which was fabricated as Example 1 (configuration of well layers and barrier layers in the light-emitting layer being omitted). As shown in FIG. 1, an SP layer formed of AlN is stacked on a sapphire substrate having a c-plane through a lattice-mismatch crystal epitaxial growth method. On the SP layer, the following layers are sequentially formed: an undoped GaN undercoat layer (thickness: 8 μm); a highly-Ge-doped GaN contact layer (electron concentration: $1 \times 10^{19}$ cm$^{-3}$, thickness: 2 μm); an Si-doped In$_{0.02}$Ga$_{0.98}$N clad layer (electron concentration: $1 \times 10^{18}$ cm$^{-3}$, thickness: 20 nm); a light-emitting layer of a multiple quantum well structure including 6 Si-doped GaN barrier layers (electron concentration: $3 \times 10^{17}$ cm$^{-3}$, thickness of each layer: 15 nm) and 5 undoped In$_{0.08}$Ga$_{0.92}$N well layers (thickness of each layer: 3 nm); an Mg-doped p-type Al$_{0.05}$Ga$_{0.95}$N clad layer (thickness: 16 nm); and an Mg-doped p-type Al$_{0.02}$Ga$_{0.98}$N contact layer (hole concentration: $8 \times 10^{17}$ cm$^{-3}$, thickness: 0.2 μm).

The aforementioned gallium nitride-based compound semiconductor multilayer structure was fabricated by means of MOCVD through the following procedure.

Firstly, a sapphire substrate was placed in a stainless reactor furnace that can heat a plurality of substrates by means of a carbon susceptor heated by an induction heater. The susceptor has a mechanism such that the susceptor itself is rotatable and it can rotate the substrates. The sapphire substrate was placed on the carbon susceptor for heating, the operation being performed in a nitrogen-substituted glove box. After introduction of the substrate, the reactor furnace was purged with nitrogen.

After passage of nitrogen for 8 minutes, the substrate temperature was elevated, over 10 minutes, to 600° C. by means of the induction heater, and the pressure inside the furnace was adjusted to 15 kPa (150 mbar). While the substrate temperature was maintained at 600° C., the substrate surface was thermally cleaned by allowing the substrate to stand for 2 minutes under flow of hydrogen and nitrogen.

After completion of thermal cleaning, the valve of a nitrogen carrier gas feeding pipe was closed, and only hydrogen was supplied to the reactor furnace.

After the carrier gas was changed to hydrogen, the substrate temperature was elevated to 1,150° C. After confirming that a constant temperature of 1,150° C. was attained, a gas containing TMAl vapor was supplied to the reactor furnace by opening the corresponding valve. The supplied TMAl was caused to react with N atoms which had been released through decomposition of deposits on an inner wall of the reactor furnace, thereby depositing AlN on the sapphire substrate.

After supply of TMAl for 7 minutes and 30 seconds, the valve was closed to stop supply of the gas containing TMAl vapor to the reactor furnace. The conditions were maintained for 4 minutes, whereby the TMAl vapor remaining in the furnace was completely removed. Subsequently, ammonia gas was supplied to the furnace by opening the corresponding valve.

Four minutes after the start of supply of ammonia gas, the susceptor temperature was lowered to 1,040° C. under an ammonia flow and, simultaneously, the pressure inside the furnace was adjusted to 40 kPa (400 mbar). During lowering of the susceptor temperature, the flow rate of TMGa was regulated by means of a flow controller.

After confirming that the substrate temperature was lowered to 1,040° C. and the substrate maintained a constant temperature of 1,040° C., TMGa was supplied into the furnace by opening the corresponding valve, so as to grow undoped GaN. The growth was performed for about 4 hours, thereby forming the aforementioned GaN layer.

Thus, an undoped GaN undercoat layer having a thickness of about 8 μm was formed.

Additionally, a highly Ge-doped n-type GaN contact layer was grown on the undoped GaN undercoat layer. After the growth of the undoped GaN undercoat layer, the supply of TMGa into the furnace was stopped, the substrate temperature was increased to 1080° C. in one minute, and the temperature was maintained for three minutes to stabilize the same. During the process, the flow rate of tetramethylgermanium (TMGe) was controlled. The flow rate was determined in advance and was controlled so that the electron concentration of the Ge-doped GaN contact layer was about $2 \times 10^{19}$ cm$^{-3}$. Ammonia was continuously supplied into the furnace at the same flow rate.

After stabilizing the temperature for three minutes, a Ge-doped n-type GaN having the thickness of 10 nm and an undoped GaN having the thickness of 10 nm were grown alternately in this order for 100 periods to grow a n-type GaN contact layer of about 2 μm. The Ge-doped GaN layer was produced by supplying TMGa and TMGe into the furnace. The undoped GaN layer was produced by supplying TMGa. Thus, an n-type GaN contact layer having an average carrier concentration of about $1 \times 10^{19}$ cm$^{-3}$.

After the growth of the last undoped GaN layer, the supply of TMGa into the furnace was stopped by switching the TMGa valve. The carrier gas was changed from hydrogen to nitrogen by switching the valve while ammonia was continuously introduced. Then, the temperature of the substrate was lowered from 1080° C. to 720° C.

During the lowering of the temperature inside the furnace, the flow rate of $SiH_4$ was modified. The flow rate had been predetermined in advance, and the flow was regulated so as to control the electron concentration of the Si-doped InGaN clad layer to $1\times10^{18}$ cm$^{-3}$. Ammonia was supplied continuously into the furnace, but the flow rate was unchanged.

Then, after the condition in the furnace was stabilized, the valves for TMIn, TEGa and $SiH_4$ were switched at the same time to start supplying the materials into the furnace. The materials were continuously supplied for predetermined time to form a Si-doped $In_{0.02}Ga_{0.98}N$ clad layer having a thickness of 20 nm.

Thereafter, a light-emitting layer of a multiple quantum well structure comprising a well layer and a barrier layer, a p-type AlGaN clad layer, and a p-type AlGaN contact layer were formed according to a substrate temperature profile shown in FIG. 2. A well layer, a barrier layer A and a barrier layer C were formed at a substrate temperature T1, a barrier layer B was formed at a substrate temperature T2, and a p-type AlGaN clad layer and a p-type AlGaN contact layer were formed at a substrate temperature T3. In this Example, the p-type AlGaN clad layer and the p-type AlGaN contact layer were grown at the same temperatures T3, but these layers may be grown at different temperatures.

After forming the Si-doped $In_{0.02}Ga_{0.98}N$ clad layer, the valves for TMIn, TEGa and $SiH_4$ were switched to stop the supply of these raw materials. After the supply of the raw materials was stopped, the setting of the supply amount of $SiH_4$ was changed. The amount in which this material should be passed was previously studied, and the supply amount was adjusted to give an Si-doped GaN barrier layer having an electron density of $3\times10^{17}$ cm$^{-3}$. The Si-doped GaN barrier layer was formed as follows.

The supply of TEGa and $SiH_4$ into the furnace was started while keeping the substrate temperature at 720° C. (T1), and after a thin barrier layer A comprising an Si-doped GaN was formed for a predetermined time, the supply of TEGa and $SiH_4$ was stopped. In this state of the growth being interrupted, the susceptor temperature was elevated to 920° C. (T2) and, when the temperature was stabilized, the valves for TEGa and $SiH_4$ were switched to restart the supply of TEGa and $SiH_4$ into the furnace without changing the substrate temperature, the pressure in the furnace, and the flow rate or kind of each of the ammonia gas and the carrier gas. At the same substrate temperature of 920° C. (T2), a barrier layer B was grown for a specified time. After the growth of the barrier layer B, the supply of TEGa and $SiH_4$ into the furnace was stopped. Subsequently, the susceptor temperature was lowered to 720° C. (T1), the supply of TEGa and $SiH_4$ was started to grow a barrier layer C, and the valves were again switched to stop the supply of TEGa and $SiH_4$, thereby completing the growth of a GaN barrier layer. In this way, an Si-doped GaN barrier layer having a three-layer structure consisting of barrier layers A, B and C and having a total thickness of 15 nm was formed.

After the growth of the GaN barrier layer, the supply of TEGa and $SiH_4$ stopped for 30 seconds. Then, TEGa and TMIn were supplied into the furnace by switching the valves for TEGa and TMIn, while the pressure in the furnace and the flow rates and kinds of ammonia gas and of the carrier gas were maintained, to form a well layer. After supplying TEGa and TMIn for predetermined time, only the supply of TMIn was stopped by switching the valve again to finish the growth of the $In_{0.08}Ga_{0.92}N$ well layer. At that time, a $In_{0.08}Ga_{0.92}N$ well layer having a thickness of 3 nm was formed. After that, $SiH_4$ was supplied to form a second barrier layer.

The above described processes were repeated 5 times to form five Si-doped GaN barrier layers and five $In_{0.08}Ga_{0.92}N$ well layers. In the manufacturing processes of the well layers and the barrier layers, after the barrier layer A was formed at 720° C. (T1), the growth of the semiconductor layer was stopped by stopping the supply of a III group material during the heating process to 920° C. (T2), in order to form the barrier layer B.

After the fifth $In_{0.08}Ga_{0.92}N$ well layer was formed, the formation of a sixth barrier layer was subsequently started. In the formation of the sixth barrier layer, the supply of $SiH_4$ was restarted and, after forming a thin barrier layer A comprising an Si-doped GaN, the substrate temperature was elevated to 920° C. (T2) while continuing the supply of TEGa and $SiH_4$ into the furnace. At the same substrate temperature of 920° C. (T2), a barrier layer B was grown for a specified time. After the growth of the barrier layer B, the supply of TEGa and $SiH_4$ into the furnace was stopped. Subsequently, the substrate temperature was lowered to 720° C. (T1), the supply of TEGa and $SiH_4$ was started, to grow a barrier layer C, and the valves were again switched to stop the supply of TEGa and $SiH_4$, thereby completing the growth of a GaN barrier layer. In this way, an Si-doped GaN barrier layer having a three-layer structure consisting of barrier layers A, B and C and having a total thickness of 15 nm was formed.

According to the above described method, a light-emitting layer of a multiple quantum well structure containing well layers (the first to fourth layers) having non-uniform thicknesses and a well layer having a uniform thickness (the fifth layer) was formed.

On the outermost Si-doped GaN barrier layer of the light-emitting layer, an Mg-doped p-type $Al_{0.05}Ga_{0.95}N$ clad layer was formed.

After completion of the growth of the last Si-doped GaN barrier layer, and stopping the supply of TEGa and $SiH_4$, the substrate temperature was elevated to 1,000° C. (T3). The carrier gas was changed to hydrogen, and the pressure inside the furnace was adjusted to 15 kPa (150 mbar). After the pressure inside the furnace became constant, sources (TMGa, TMAl, and $Cp_2Mg$) were supplied to the furnace by opening the corresponding valves. The growth was performed for about three minutes, after which supply of TMGa, TMAl and $Cp_2Mg$ was stopped, thereby terminating the growth of an Mg-doped p-type $Al_{0.05}Ga_{0.95}N$ clad layer. As a result, an Mg-doped p-type $Al_{0.05}Ga_{0.95}$ clad layer having a thickness of 16 nm was formed.

On the Mg-doped p-type $Al_{0.05}Ga_{0.95}N$ clad layer, an Mg-doped p-type GaN contact layer was formed.

After completion of the growth of the Mg-doped $Al_{0.05}Ga_{0.95}N$ clad layer by stopping supply of TMGa, TMAl, and $Cp_2Mg$, the pressure inside the furnace was adjusted to 20 kPa (200 mbar). After the pressure inside the furnace became constant, sources (TMGa, TMAl and $Cp_2Mg$) were supplied to the furnace by opening the corresponding valves. The flow rate of $Cp_2Mg$ had been predetermined in advance, and the flow was regulated so as to control the hole concentration of the Mg-doped $Al_{0.02}Ga_{0.98}N$ contact layer to $8\times10^{17}$ cm$^{-3}$. Thereafter, the growth was performed for about 12 minutes, after which supply of TMGa, TMAl and $Cp_2Mg$ was stopped, thereby terminating the growth of the Mg-doped GaN layer. As a result, the Mg-doped $Al_{0.02}Ga_{0.98}N$ contact layer was formed to a thickness of 0.2 μm.

After completion of the growth of the Mg-doped $Al_{0.02}Ga_{0.98}N$ contact layer, the electricity supply to the induction heater was stopped, and the substrate temperature was lowered to room temperature over 20 minutes. During the process of lowering the temperature, the atmosphere in the reactor furnace was formed exclusively of nitrogen. When the substrate temperature was confirmed to have been lowered to room temperature, the thus-fabricated gallium nitride-based compound semiconductor multilayer structure was removed to the atmosphere.

Through the above-described procedure, the gallium nitride-based compound semiconductor multilayer structure for producing a semiconductor light-emitting device was fabricated. Even though the Mg-doped $Al_{0.02}Ga_{0.98}N$ contact layer had not undergone annealing for activating the p-type carrier, the $Al_{0.02}Ga_{0.98}N$ contact layer exhibited p-type conductivity.

By use of the aforementioned gallium nitride-based compound semiconductor multilayer structure, a light-emitting diode, which is a type of semiconductor light-emitting device, was fabricated.

On the surface of the p-type AlGaN contact layer of the gallium nitride-based compound semiconductor multilayer structure produced, a positive electrode comprising a transparent electrode formed by stacking Au and NiO in this order from the contact layer side by a method well-known in the art and a pad electrode formed by sequentially stacking Ti, Au, Al and Au thereon was produced.

Figure 3:
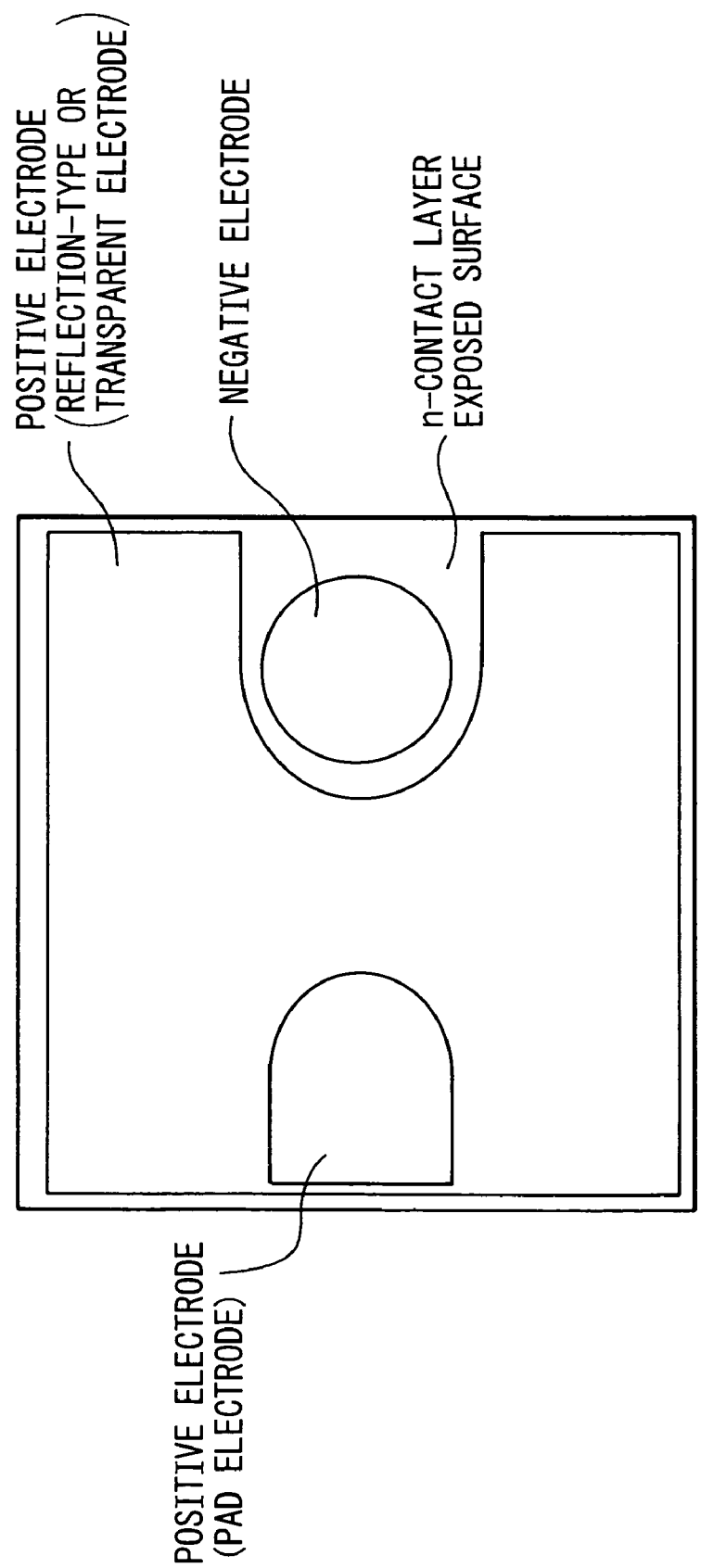
FIG. 3 is a schematic view of an electrode configuration of the light-emitting diode fabricated in the Example and the Comparative Example.
Figure 4:
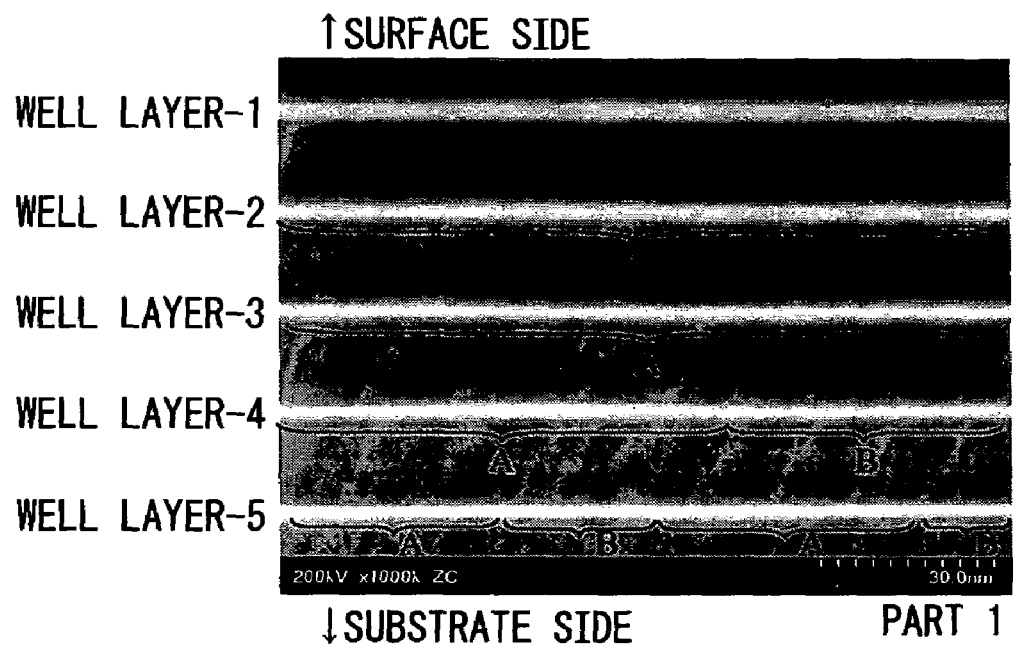
FIG. 4 is an exemplary cross-section TEM photograph of the gallium nitride-based compound semiconductor multilayer structure fabricated in Example 1.
Figure 5:
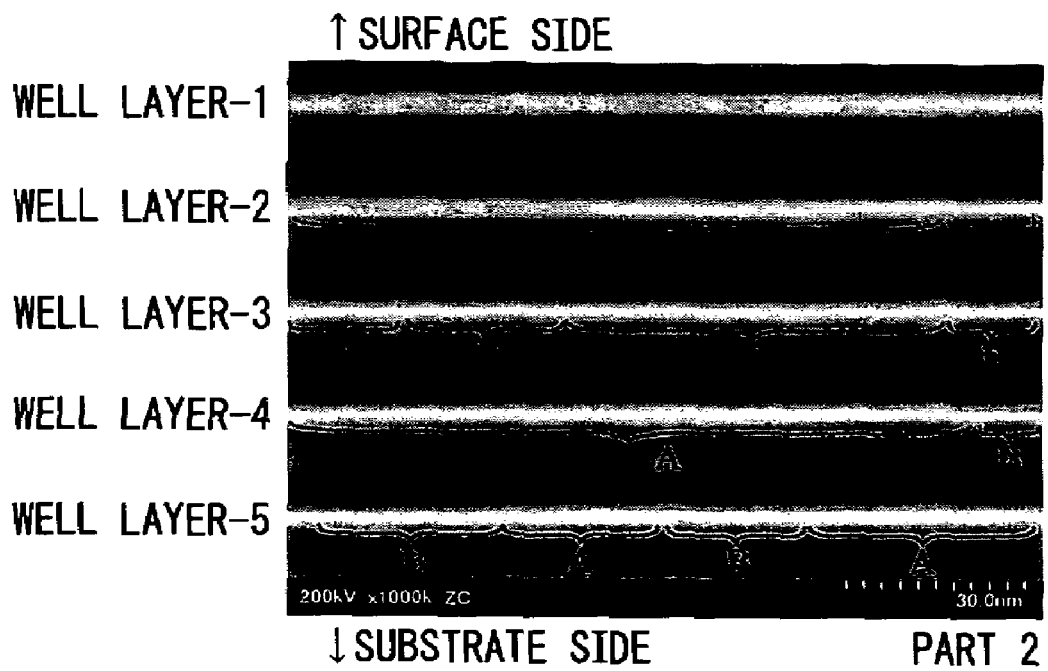
FIG. 5 is another exemplary cross-section TEM photograph of the gallium nitride-based compound semiconductor multilayer structure fabricated in Example 1.
Figure 6:
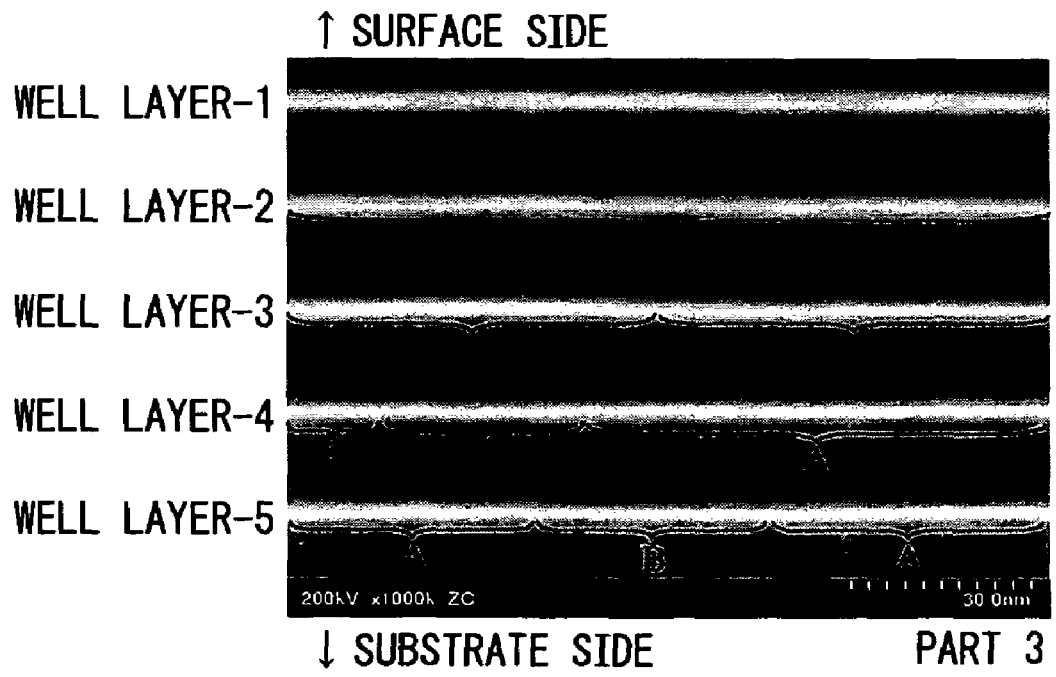
FIG. 6 is another exemplary cross-section TEM photograph of the gallium nitride-based compound semiconductor multilayer structure fabricated in Example 1.
Figure 7:
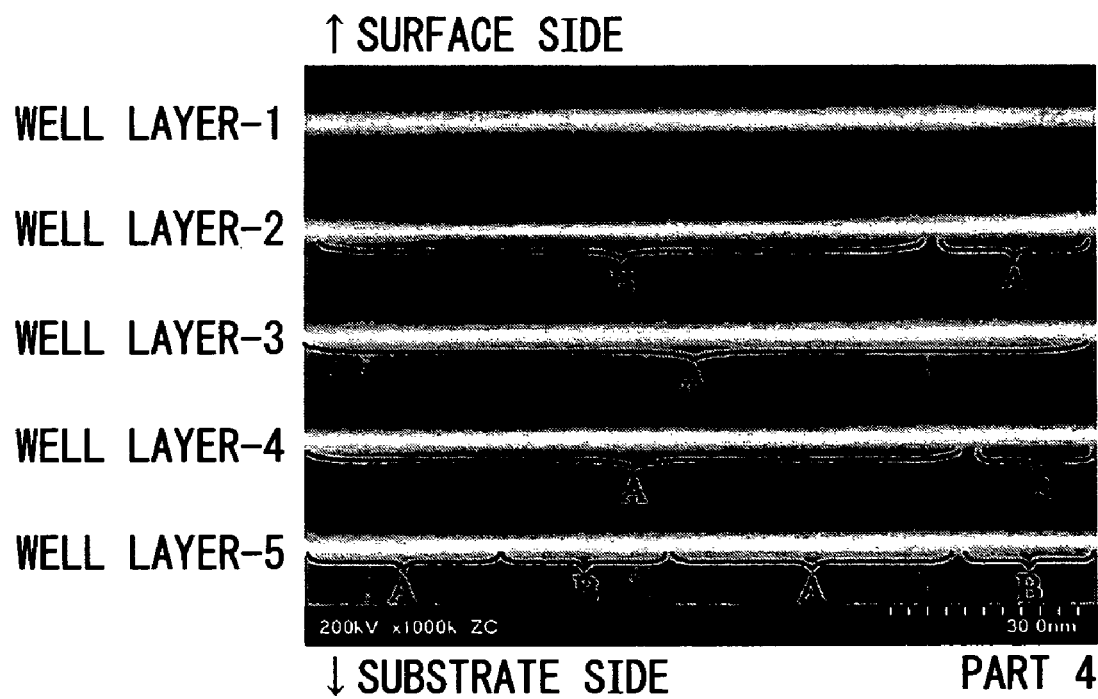
FIG. 7 is another exemplary cross-section TEM photograph of the gallium nitride-based compound semiconductor multilayer structure fabricated in Example 1.
Figure 8:
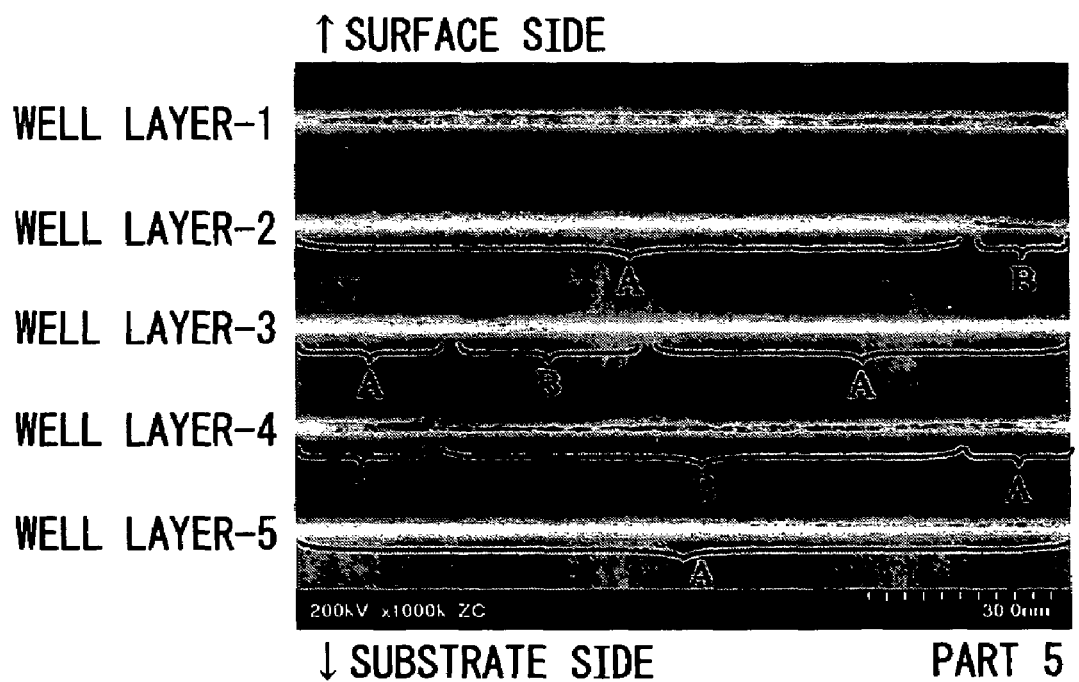
FIG. 8 is another exemplary cross-section TEM photograph of the gallium nitride-based compound semiconductor multilayer structure fabricated in Example 1.
Figure 9:
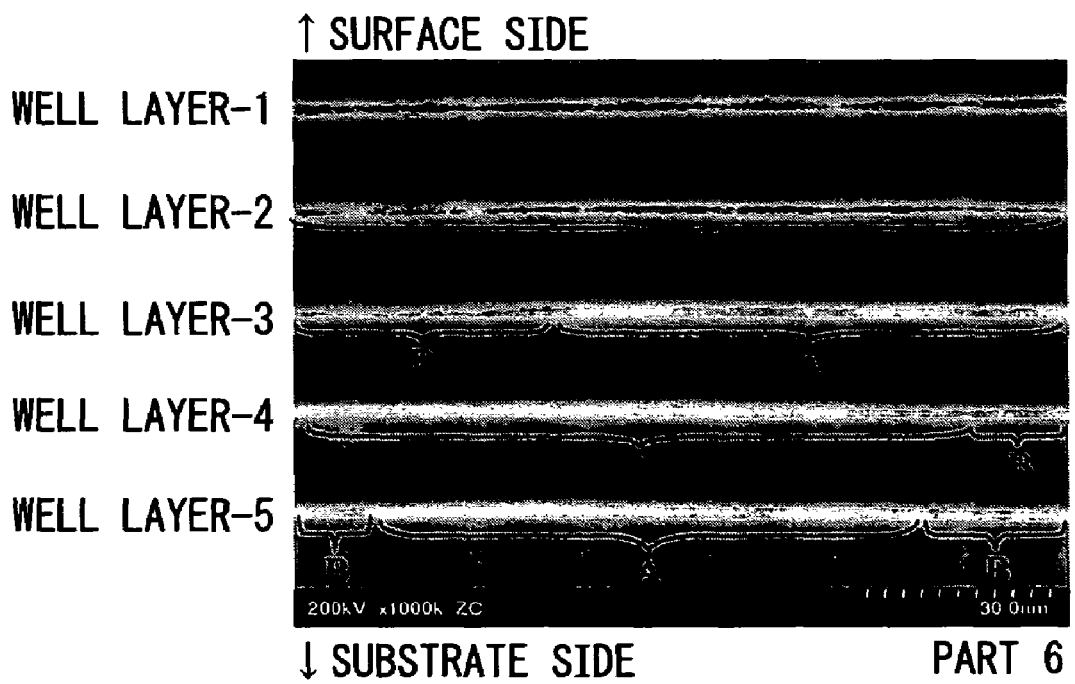
FIG. 9 is another exemplary cross-section TEM photograph of the gallium nitride-based compound semiconductor multilayer structure fabricated in Example 1.
Figure 10:
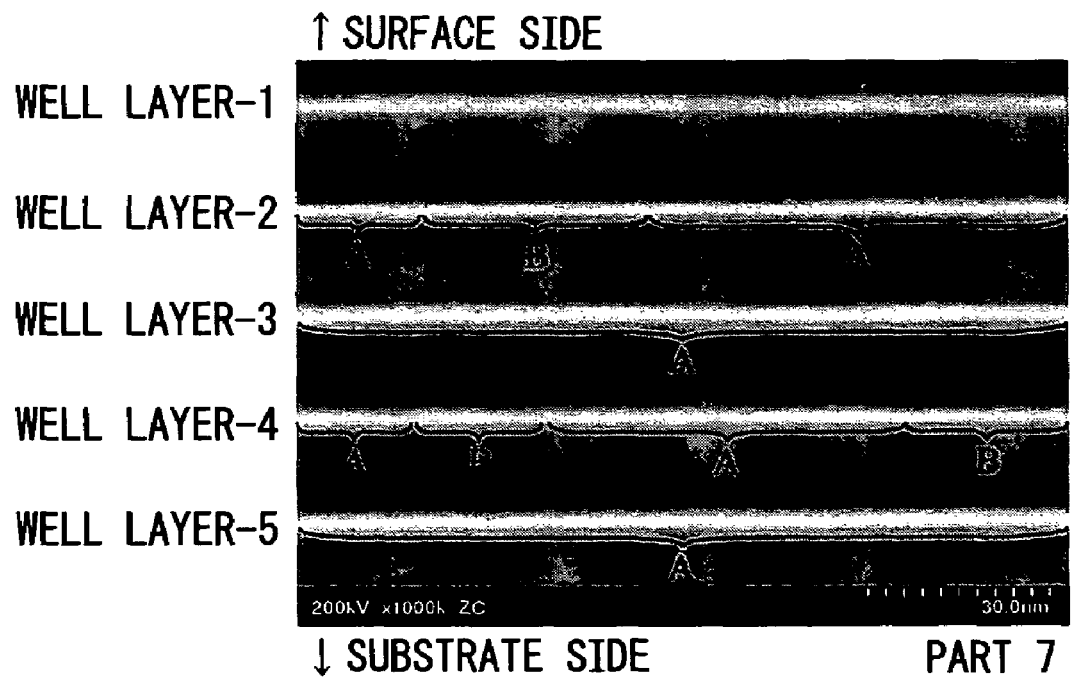
FIG. 10 is another exemplary cross-section TEM photograph of the gallium nitride-based compound semiconductor multilayer structure fabricated in Example 1.
Figure 11:
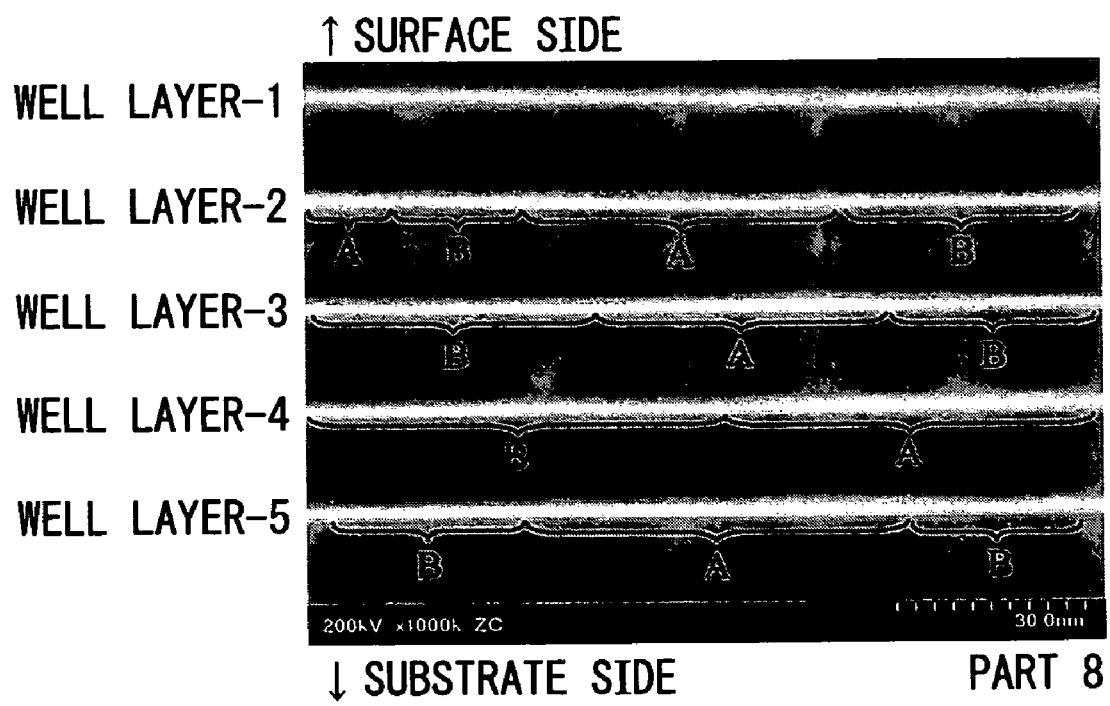
FIG. 11 is another exemplary cross-section TEM photograph of the gallium nitride-based compound semiconductor multilayer structure fabricated in Example 1.

Subsequently, the aforementioned gallium nitride-based compound semiconductor multilayer structure was dry-etched so as to expose a negative electrode portion of the highly-Ge-doped n-type GaN contact layer. Ti and Al were successively formed on the exposed portion of the contact layer in this order, thereby forming a negative electrode. Through these operations, electrodes of the shape shown in FIG. 3 were fabricated.

The back of the sapphire substrate of the gallium nitride-based compound semiconductor multilayer structure which had been provided with the positive electrode and the negative electrode in the above manner was ground and polished, thereby providing a mirror surface. Subsequently, the gallium nitride-based compound semiconductor multilayer structure was cut into square (300 μm×300 μm) chips. The thus-formed chip was placed on a lead frame and wired to the lead frame with gold wire, thereby fabricating a light-emitting diode.

When an operating current was applied to the positive electrode and the negative electrode of the thus-fabricated light-emitting diode in a forward direction, the diode exhibited a forward voltage (an operating voltage) of 3.3 V at a current of 20 mA, an emission wavelength of 460 nm, and an light emission output of 5.5 mW. Such characteristics of the light-emitting diode can be attained without variation among light-emitting diodes cut and produced from virtually the entirety of the above-fabricated gallium nitride-based compound semiconductor multilayer structure.

A current of 30 mA was passed through this light-emitting diode in the forward direction and when an aging test, measuring the light emission output at the start and after 100 hours, was performed and the degradation percentage of the light emission output was compared between at the start and after 100 hours, the output degradation percentage was 9% and good.

Also, the reverse voltages at the current of 10 μA before and after the power supply at the current of 30 mA and for 100 hours were measured and compared with each other. The change rate of the reverse voltages was 0%.

FIGS. 4 to 11 show examples of photographs observed at 1,000,000 magnifications by a cross-sectional TEM. Eight parts spaced at 20 μm distance from each other in a cross section were observed. The serial numbers for the well layers are assigned 1 to 5 from the surface side (the semiconductor side) of the nitride semiconductor multilayer structure. Thus, the well layer 1 is located on the p-type semiconductor layer side and the well layer 5 is located on the n-type semiconductor layer side. In the figures, A represents a thick part and B represents a thin part. Tables, attached to FIGS. 4 to 11, show the maximum thickness and the minimum thickness of each well layer at the respective parts.

Considering the eight parts shown in FIGS. 4 to 11, the maximum thickness, the minimum thickness, the average thickness, and the ratio of the difference between the maximum thickness and the average thickness to the average thickness (the ratio of the difference between minimum thickness and the average thickness to the average thickness) were calculated and shown in Table 1.

TABLE 1

| Well layer | Maximum thickness (nm) | Minimum thickness (nm) | Average thickness (nm) | Ratio of difference |
|---|---|---|---|---|
| 1 | 3.1 | 2.8 | 2.95 | ±5.1% |
| 2 | 3.2 | 1.8 | 2.50 | ±28.0% |
| 3 | 3.1 | 1.9 | 2.50 | ±24.0% |
| 4 | 3.1 | 1.6 | 2.35 | ±31.9% |
| 5 | 3.2 | 1.7 | 2.45 | ±30.6% |

From Table 1, it can be seen that the range of the thicknesses of the well layer 1 from its average thickness is ±5.1% and is in the range of 10%, and that the layer is a well layer having a uniform thickness in the present invention. It can also be seen that the ranges of the thicknesses of the well layers 2 to 5 from their average thicknesses are ±28.0%, ±24.0%, ±31.9% and ±30.6%, respectively, and are more than 10%, and that the layers are well layers having non-uniform thicknesses in the present invention. In each of the well layers 2 to 5, a part having a thickness larger than its average thickness is a thick part and a part having a thickness smaller than its average thickness is a thin part.

From FIGS. 4 to 11, the thickness of the barrier layer was about 15 nm. The barrier layer completely filled the gap between the thicknesses of the thin part and the thick part of the well layer.

FIGS. 12 to 19 are TEM photographs in which the neighborhoods of the parts in FIGS. 4 to 11 was observed at a 200,000 magnification. In these figures, it can be seen that the well layer 1 has a uniform thickness.

From these TEM photographs, the widths of the thick parts and of the thin parts of the well layers 2 to 5 were measured and the distributions of the same were evaluated. The thick or thin part of each well layer was determined based on the average thickness of each well layer calculated from FIGS. 4 to 11. The results are shown in Table 2. For example, in the well layer 2 in the TEM photograph of FIG. 12, the widths were, in this order from the left side of the field of view in the TEM photograph, 250 nm in the thick part, 60 nm in the thin part, 105 nm in the thick part, 35 nm in the thin part, and 75 nm in the thick part. In Table 2, the thicknesses are described as thick part (250 nm)—thin part (60 nm)—thick part (105 nm)—thin part (35 nm)—thick part (75 nm).

TABLE 2

Figure 12:
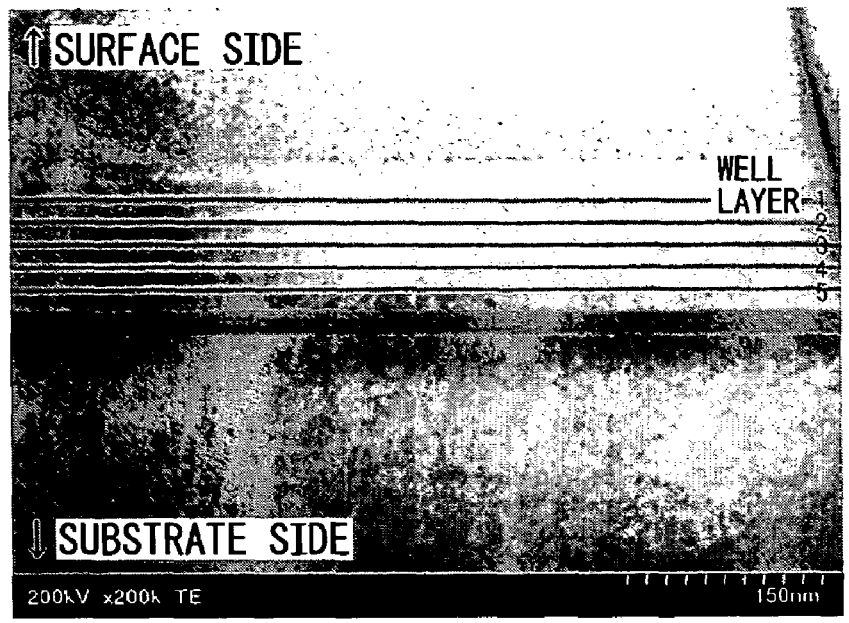
FIG. 12 is another exemplary cross-section TEM photograph of the gallium nitride-based compound semiconductor multilayer structure fabricated in Example 1.
Figure 13:
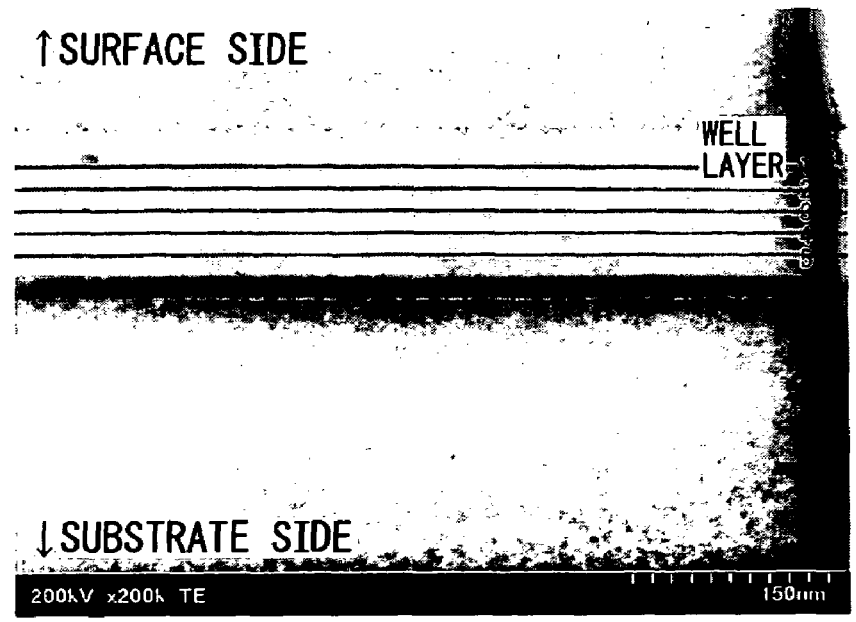
FIG. 13 is another exemplary cross-section TEM photograph of the gallium nitride-based compound semiconductor multilayer structure fabricated in Example 1.
Figure 14:
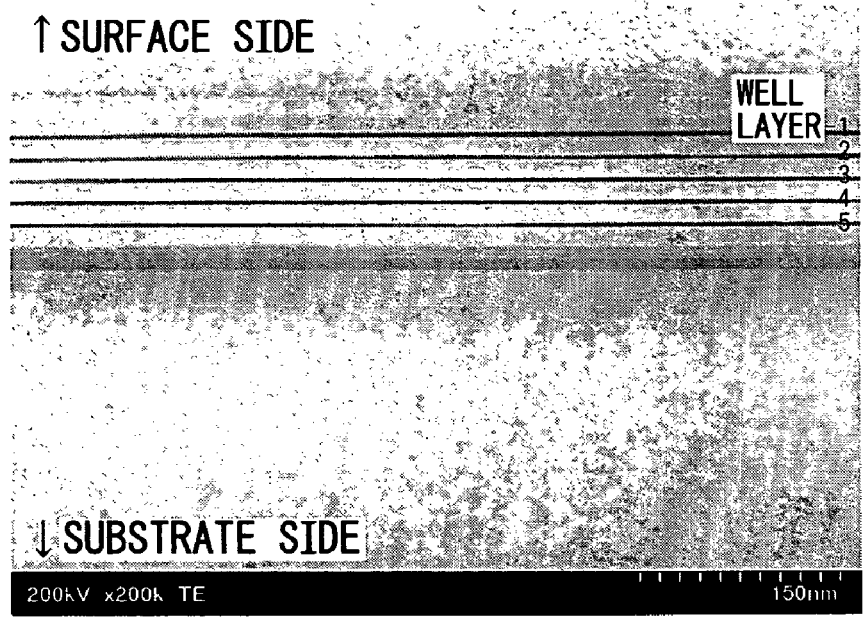
FIG. 14 is another exemplary cross-section TEM photograph of the gallium nitride-based compound semiconductor multilayer structure fabricated in Example 1.
Figure 15:
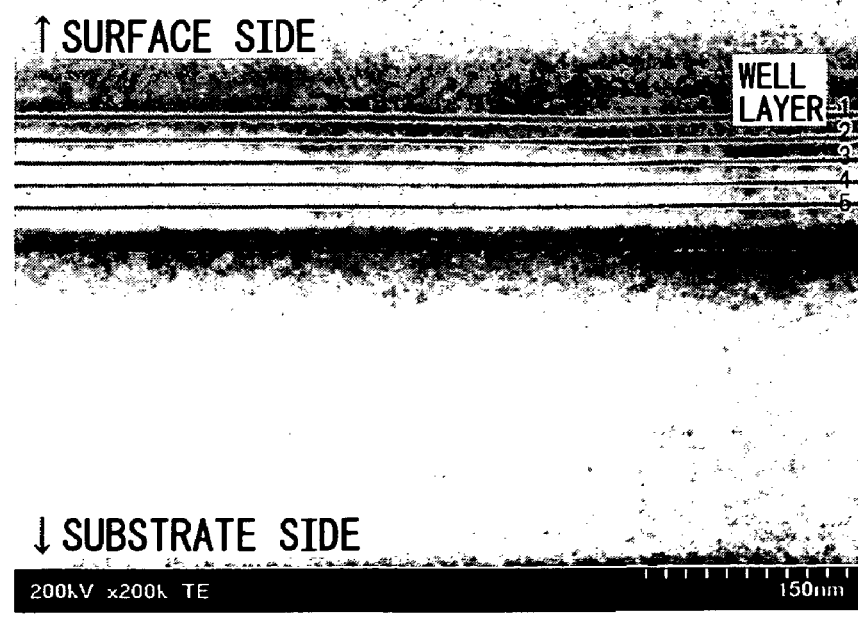
FIG. 15 is another exemplary cross-section TEM photograph of the gallium nitride-based compound semiconductor multilayer structure fabricated in Example 1.
Figure 16:
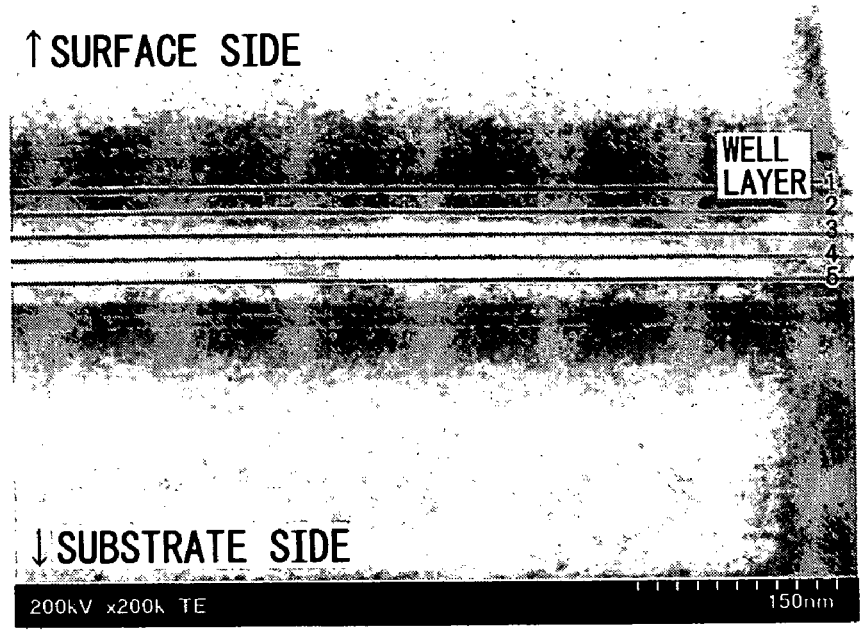
FIG. 16 is another exemplary cross-section TEM photograph of the gallium nitride-based compound semiconductor multilayer structure fabricated in Example 1.
Figure 17:
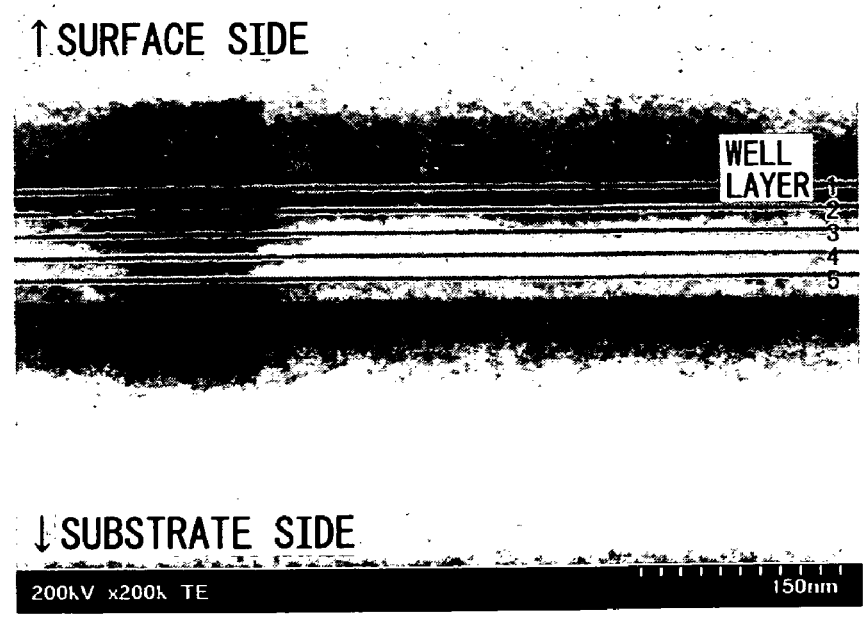
FIG. 17 is another exemplary cross-section TEM photograph of the gallium nitride-based compound semiconductor multilayer structure fabricated in Example 1.
Figure 18:
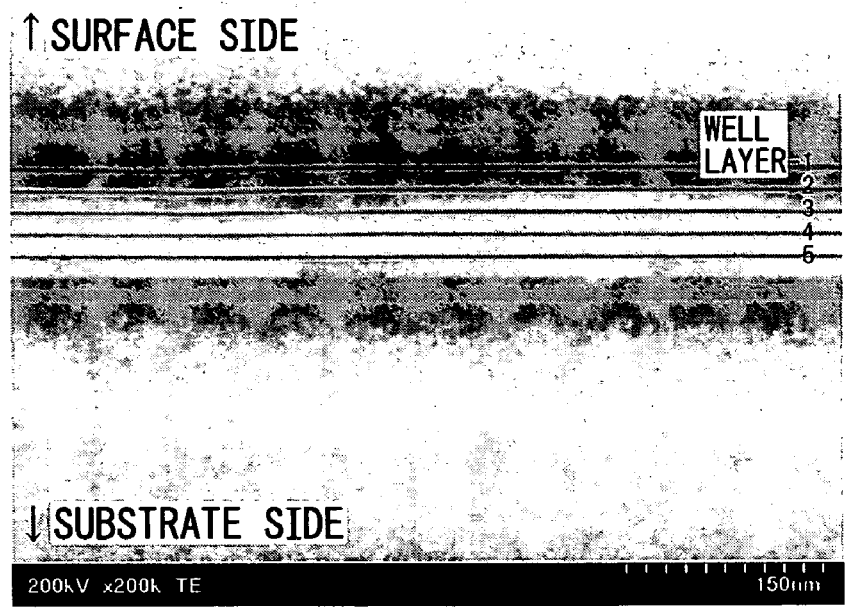
FIG. 18 is another exemplary cross-section TEM photograph of the gallium nitride-based compound semiconductor multilayer structure fabricated in Example 1.
Figure 19:
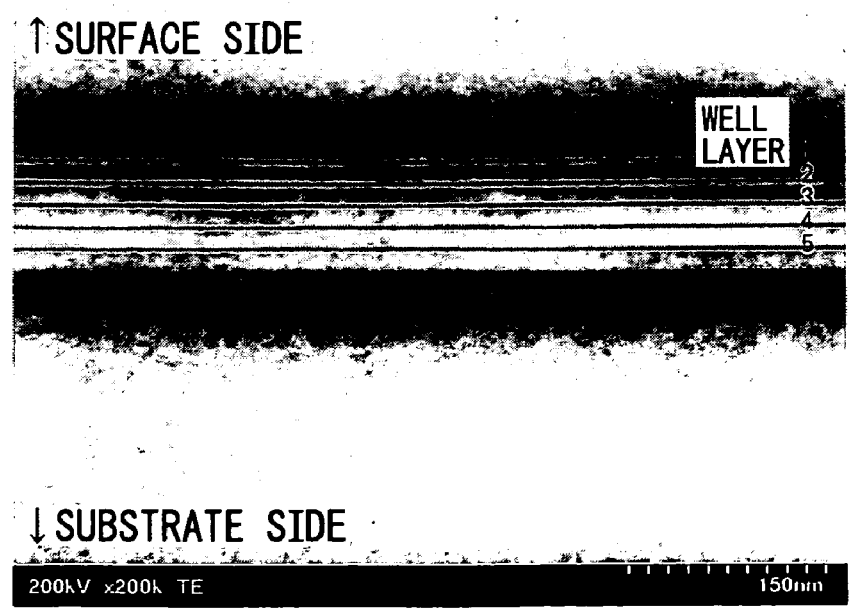
FIG. 19 is another exemplary cross-section TEM photograph of the gallium nitride-based compound semiconductor multilayer structure fabricated in Example 1.

| TEM photograph | Well layer | Distribution of thick part and thin part | Variation Thin part | Variation Thick part |
|---|---|---|---|---|
| FIG. 12 | 2 | Thick part(250 nm)-thin part(60 nm)-thick part(105 nm)-thin part(35 nm)-thick part(75 nm) | 35-60 nm | 75-250 nm |
|  | 3 | Thick part(260 nm)-thin part(45 nm)-thick part(220 nm) | 45 nm | 220-260 nm |
|  | 4 | Thick part(160 nm)-thin part(100 nm)-thick part(220 nm) | 100 nm | 160-220 nm |
|  | 5 | Thick part(260 nm)-thin part(70 nm)-thick part(120 nm) | 70 nm | 120-260 nm |
| FIG. 13 | 2 | Thick part(410 nm)-thin part(35 nm)-thick part(50 nm)-thin part(30 nm) | 30-35 nm | 50-410 nm |
|  | 3 | Thick part(470 nm)-thin part(30 nm) | 30 nm | 470 nm |
|  | 4 | Thick part(185 nm)-thin part(40 nm)-thick part(235 nm)-thin part(80 nm) | 40-80 nm | 185-235 nm |
|  | 5 | Thick part(145 nm)-thin part(50 nm)-thick part(245 nm)-thin part(40 nm) | 40-50 nm | 145-245 nm |
| FIG. 14 | 2 | Thick part(270 nm)-thin part(65 nm)-thick part(20 nm)-thin part(55 nm) | 55-65 nm | 20-270 nm |
|  | 3 | Thick part(320 nm)-thin part(80 nm)-thick part(70 nm)-thin part(50 nm) | 50-80 nm | 70-320 nm |
|  | 4 | Thick part(270 nm)-thin part(90 nm)-thick part(120 nm)-thin part(30 nm) | 30-90 nm | 120-270 nm |
|  | 5 | Thick part(310 nm)-thin part(40 nm)-thick part(200 nm) | 40 nm | 200-310 nm |
| FIG. 15 | 2 | Thick part(190 nm)-thin part(60 nm)-thick part(120 nm)-thin part(60 nm)-thick part(75 nm) | 60 nm | 75-190 nm |
|  | 3 | Thick part(320 nm)-thin part(40 nm)-thick part(60 nm)-thin part(60 nm) | 40-60 nm | 60-320 nm |
|  | 4 | Thin part(60 nm)-thick part(65 nm)-thin part(90 nm)-thick part(140 nm)-thin part(55 nm) | 55-90 nm | 65-140 nm |
|  | 5 | Thick part(300 nm)-thin part(45 nm)-thick part(65 nm)-thin part(60 nm) | 45-60 nm | 65-300 nm |
| FIG. 16 | 2 | Thick part(450 nm)-thin part(50 nm)-thick part(40 nm)-thin part(35 nm) | 35-50 nm | 40-450 nm |
|  | 3 | Thick part(580 nm) | — | 580 nm |
|  | 4 | Thick part(520 nm)-thin part(70 nm) | 70 nm | 520 nm |
|  | 5 | Thick part(540 nm)-thin part(55 nm) | 55 nm | 540 nm |
| FIG. 17 | 2 | Thin part(40 nm)-thick part(250 nm)-thin part(100 nm)-thick part(130 nm)-thin part(60 nm) | 40-100 nm | 130-250 nm |
|  | 3 | Thick part(500 nm)-thin part(75 nm) | 75 nm | 500 nm |
|  | 4 | Thick part(580 nm) | — | 580 nm |
|  | 5 | Thick part(600 nm) | — | 600 nm |
| FIG. 18 | 2 | Thin part(65 nm)-thick part(45 nm)-thin part(30 nm)-thick part(320 nm)-thin part(100 nm) | 30-100 nm | 45-320 nm |
|  | 3 | Thick part(330 nm)-thin part(50 nm)-thick part(180 nm) | 50 nm | 180-300 nm |
|  | 4 | Thick part(60 nm)-thin part(100 nm)-thick part(300 nm)-thin part(50 nm) | 50-100 nm | 60-300 nm |
|  | 5 | Thin part(40 nm)-thick part(330 nm)-thin part(60 nm) | 40-60 nm | 330 nm |
| FIG. 19 | 2 | Thin part(80 nm)-thick part(95 nm)-thin part(95 nm)-thick part(140 nm)-thin part(70 nm) | 70-95 nm | 95-140 nm |
|  | 3 | Thick part(130 nm)-thin part(60 nm)-thick part(250 nm)-thin part(100 nm) | 60-100 nm | 130-250 nm |
|  | 4 | Thin part(70 nm)-thick part(275 nm)-thin part(90 nm)-thick part(100 nm)-thin part(40 nm) | 40-90 nm | 100-275 nm |
|  | 5 | Thin part(100 nm)-thick part(85 nm)-thin part(35 nm)-thick part(105 nm)-thin part(60 nm) | 35-100 nm | 85-105 nm |

The distributions of the widths of the thin parts and of the thick parts of each well layer calculated from Table 2 is 30 to 100 nm in the well layer 2, 30 to 100 nm in the well layer 3, 30 to 100 nm in the well layer 4 and 35 to 100 nm in the well layer 5, for the thin part, and 20 to 450 nm in the well layer 2, 60 to 580 nm in the well layer 3, 60 to 580 nm in the well layer 4 and 65 to 600 nm in the well layer 5, for the thick part.

Examples 2 to 13 and Comparative Examples 1 to 8

Light-emitting diodes were produced in the same manner as in Example 1 except for changing the growth temperature T1 of the well layer, barrier layer A and barrier layer C, the growth temperature T2 of the barrier layer B, and the growth temperature T3 of the p-type clad layer and the p-type contact layer, and the obtained light-emitting diodes were evaluated in the same manner as in Example 1.

The temperature conditions and evaluation results of Examples and Comparative Examples are shown in Table 3. In Table 3, the results of Example 1 are shown together.

TABLE 3

|  | T1 (° C.) | T2 (° C.) | T3 (° C.) | T3 − T1 (° C.) | T3 − T2 (° C.) | T2 − T1 (° C.) | Operating Voltage (V) | Light Emission Output (mW) | Percentage Change in Output |
|---|---|---|---|---|---|---|---|---|---|
| Example 1 | 720 | 920 | 1000 | 280 | 80 | 200 | 3.30 | 5.5 | −9.0% |
| Example 2 | 730 | 920 | 1000 | 270 | 80 | 190 | 3.30 | 5.5 | −7.0% |
| Example 3 | 740 | 920 | 1000 | 260 | 80 | 180 | 3.30 | 5.6 | −6.0% |
| Example 4 | 750 | 920 | 1000 | 250 | 80 | 170 | 3.30 | 5.6 | −6.0% |
| Example 5 | 720 | 920 | 960 | 240 | 40 | 200 | 3.35 | 5.5 | −4.0% |
| Example 6 | 720 | 920 | 970 | 250 | 50 | 200 | 3.30 | 5.5 | −3.5% |
| Example 7 | 720 | 920 | 980 | 260 | 60 | 200 | 3.30 | 5.5 | −3.5% |
| Example 8 | 720 | 920 | 990 | 270 | 70 | 200 | 3.30 | 5.5 | −6.0% |
| Example 9 | 730 | 890 | 980 | 250 | 90 | 160 | 3.30 | 5.5 | −6.5% |
| Example 10 | 730 | 900 | 980 | 250 | 80 | 170 | 3.30 | 5.5 | −4.0% |
| Example 11 | 730 | 910 | 980 | 250 | 70 | 180 | 3.33 | 5.5 | −4.0% |
| Example 12 | 730 | 920 | 980 | 250 | 60 | 190 | 3.35 | 5.5 | −3.5% |
| Example 13 | 730 | 930 | 980 | 250 | 50 | 200 | 3.37 | 5.5 | −3.5% |
| Comparative Example 1 | 700 | 920 | 1000 | 300 | 80 | 220 | 3.30 | 5.3 | −17.0% |
| Comparative Example 2 | 710 | 920 | 1000 | 290 | 80 | 210 | 3.30 | 5.4 | −12.0% |
| Comparative | 720 | 920 | 950 | 230 | 30 | 200 | 3.45 | 5 | −4.0% |

TABLE 3-continued

| | T1 (° C.) | T2 (° C.) | T3 (° C.) | T3 − T1 (° C.) | T3 − T2 (° C.) | T2 − T1 (° C.) | Operating Voltage (V) | Light Emission Output (mW) | Percentage Change in Output |
|---|---|---|---|---|---|---|---|---|---|
| Example 3 Comparative Example 4 | 720 | 920 | 1010 | 290 | 90 | 200 | 3.30 | 5.4 | −12.0% |
| Comparative Example 5 | 720 | 920 | 1020 | 300 | 100 | 200 | 3.30 | 5 | −15.0% |
| Comparative Example 6 | 730 | 880 | 980 | 250 | 100 | 150 | 3.30 | 5.5 | −11.0% |
| Comparative Example 7 | 730 | 940 | 980 | 250 | 40 | 210 | 3.70 | 5.6 | −3.5% |
| Comparative Example 8 | 730 | 950 | 980 | 250 | 30 | 220 | 3.90 | 5.8 | −3.5% |

As is apparent from Table 3, the difference (T3−T1) between the growth temperature of the p-type semiconductor layer and the growth temperature of the well layer is preferably from 240 to 280° C. so as to reduce the percentage change in output and to maintain other properties. When (T3−T1) is 230° C., as shown in Comparative Example 3, this results in a high operating voltage of 3.45 V and a reduction in the light emission output to 5 mW, though a low percentage change in output of −4.0% is obtained. When (T3−T1) is 290° C., as shown in Comparative Examples 2 and 4, a high percentage change in output of −12.0% results.

The difference (T3−T2) between the growth temperature of the p-type semiconductor layer and the growth temperature of the barrier layer B is preferably from 40 to 90° C. so as to reduce the percentage change in output and maintain other properties. When (T3−T2) is 30° C., as shown in Comparative Examples 3 and 8, this results in a high operating voltage of 3.45 V or 3.9 V and reduction in the light emission output to 5 mW, though a low percentage change in output of −4.0% is obtained. When (T3−T2) is 100° C., as shown in Comparative Examples 5 and 6, the percentage change in output exceeds 10%.

The difference (T2−T1) between the growth temperature of the barrier layer B and the growth temperature of the well layer is preferably from 160 to 200° C. so as to reduce the percentage change in output and maintain other properties. When (T2−T1) is 150° C., as shown in Comparative Example 6, a high percentage change in output of −11.0% results. When (T2−T1) is 210° C., as shown in Comparative Example 2, a high percentage change in output of 12% results. In Comparative Example 7 where (T2−T1) is 210° C., there arises a problem that the initial operating voltage increases to 3.7 V, though a small percentage change in output of −3.5%.

Example 14

FIG. 1 schematically shows a gallium nitride-based compound semiconductor multilayer structure for producing a semiconductor light-emitting device of which the structure was fabricated as this Example (configuration of well layers and barrier layers in the light-emitting layer being omitted). As shown in FIG. 1, an SP layer formed of AlN is stacked on a sapphire substrate having a c-plane through a lattice-mismatch crystal epitaxial growth method. On the SP layer, the following layers are sequentially formed: an undoped GaN undercoat layer (thickness: 8 μm); a highly-Ge-doped GaN contact layer (electron concentration: $1 \times 10^{19}$ cm$^{-3}$, thickness: 2 μm); an Si-doped $In_{0.02}Ga_{0.98}N$ clad layer (electron concentration: $1 \times 10^{18}$ cm$^{-3}$, thickness: 20 nm); a light-emitting layer of a multiple quantum well structure including 6 Si-doped GaN barrier layers (electron concentration: $3 \times 10^{17}$ cm$^{-3}$, thickness of each layer: 15 nm) and 5 undoped $In_{0.08}Ga_{0.92}N$ well layers (thickness of each layer: 3 nm); an Mg-doped p-type $Al_{0.05}Ga_{0.95}N$ clad-layer (thickness: 16 nm); and an Mg-doped p-type $Al_{0.02}Ga_{0.98}N$ contact layer (hole concentration: $8 \times 10^{17}$ cm$^{-3}$, thickness: 0.2 μm).

The aforementioned gallium nitride-based compound semiconductor multilayer structure was fabricated by means of MOCVD through the following procedure.

Firstly, a sapphire substrate was placed in a stainless reactor furnace that can heat a plurality of substrates by means of a carbon susceptor heated by an induction heater. The susceptor has a mechanism such that the susceptor itself is rotatable and it can rotate the substrates. The sapphire substrate was placed on the carbon susceptor for heating, the operation being performed in a nitrogen-substituted glove box. After introduction of the substrate, the reactor furnace was purged with nitrogen.

After passage of nitrogen for 8 minutes, the substrate temperature was elevated, over 10 minutes, to 600° C. by means of the induction heater, and the pressure inside the furnace was adjusted to 15 kPa (150 mbar). While the substrate temperature was maintained at 600° C., the substrate surface was thermally cleaned by allowing the substrate to stand for 2 minutes under flow of hydrogen and nitrogen.

After completion of thermal cleaning, a valve of a nitrogen carrier gas feeding pipe was closed, and only hydrogen was supplied to the reactor furnace.

After the carrier gas was changed to hydrogen, the substrate temperature was elevated to 1,150° C. After confirming that a constant temperature of 1,150° C. was attained, a gas containing TMAl vapor was supplied to the reactor furnace by opening the corresponding valve. The supplied TMAl was caused to react with N atoms which had been released through decomposition of deposits on an inner wall of the reactor furnace, thereby depositing AlN on the sapphire substrate.

After the supply of TMAl for 7 minutes and 30 seconds, the valve was closed to stop the supply of the gas containing TMAl vapor to the reactor furnace. The conditions were maintained for 4 minutes, whereby the TMAl vapor remaining in the furnace was completely removed. Subsequently, ammonia gas was supplied to the furnace by opening the corresponding valve.

Four minutes after the start of supply of ammonia gas, the susceptor temperature was lowered to 1,040° C. under ammonia flow and simultaneously the pressure inside the furnace was adjusted to 40 kPa (400 mbar). During lowering of the susceptor temperature, the flow rate of TMGa was regulated by means of a flow controller.

After confirming that the substrate temperature was lowered to 1,040° C. and the substrate maintained a constant temperature of 1,040° C., TMGa was supplied into the furnace by opening the corresponding valve, so as to grow undoped GaN. The growth was performed for about 4 hours, thereby forming the aforementioned GaN layer.

Thus, an undoped GaN undercoat layer having a thickness of about 8 μm was formed.

Additionally, a highly Ge-doped n-type GaN contact layer was grown on the undoped GaN undercoat layer. After the growth of the undoped GaN undercoat layer, the supply of TMGa into the furnace was stopped, the substrate temperature was increased to 1080° C. in one minute, and the temperature was maintained for three minutes to stabilize the same. During the process, the flow rate of tetramethylgermanium (TMGe) was controlled. The flow rate was determined in advance and was controlled so that the electron concentration of the Ge-doped GaN contact layer was about $2 \times 10^{19}$ cm$^{-3}$. Ammonia was continuously supplied into the furnace at the same flow rate.

After stabilizing the temperature for three minutes, a Ge-doped n-type GaN having the thickness of 10 nm and an undoped GaN having the thickness of 10 nm were grown alternately in this order for 100 cycles to grow a n-type GaN contact layer of about 2 μm. The Ge-doped GaN layer was produced by supplying TMGa and TMGe into the furnace. The undoped GaN layer was produced by supplying TMGa. Thus, an n-type GaN contact layer having an average carrier concentration of about $1 \times 10^{19}$ cm$^{-3}$.

After the growth of the last undoped GaN layer, the supply of TMGa into the furnace was stopped by switching the TMGa valve. The carrier gas was changed from hydrogen to nitrogen by switching the valve while ammonia was continuously introduced. Then, the temperature of the substrate was lowered from 1080° C. to 720° C.

During the lowering of the temperature inside the furnace, the flow rate of SiH$_4$ was modified. The flow rate had been predetermined in advance and was regulated so as to control the electron concentration of the Si-doped InGaN clad layer to $1 \times 10^{18}$ cm$^{-3}$. Ammonia was supplied continuously into the furnace, but the flow rate was unchanged.

Then, after the condition in the furnace was stabilized, the valves for TMIn, TEGa and SiH$_4$ were switched at the same time to start supplying the materials into the furnace. The materials were continuously supplied for predetermined time to form a Si-doped In$_{0.02}$Ga$_{0.98}$N clad layer having a thickness of 20 nm.

Thereafter, an light-emitting layer of a multiple quantum well structure comprising a well layer and a barrier layer, a p-type AlGaN clad layer, and a p-type AlGaN contact layer were formed according to a substrate temperature profile shown in FIG. 2. A well layer, a barrier layer A and a barrier layer C were formed at a substrate temperature of 720° C., a barrier layer B was formed at a substrate temperature of 920° C., and a p-type AlGaN clad layer and a p-type AlGaN contact layer were formed at a substrate temperature of 1000° C. In this Example, the p-type AlGaN clad layer and the p-type AlGaN contact layer were grown at the same temperatures T3, but these layers may be grown at different temperatures.

After forming the Si-doped In$_{0.02}$Ga$_{0.98}$N clad layer, the valves for TMIn, TEGa and SiH$_4$ were switched to stop the supply of these raw materials. After the supply of the raw materials was stopped, the setting of the supply amounts of TEGa and SiH$_4$ was changed. The amounts in which these materials should be passed were previously studied, and the supply amounts were adjusted to give a growth rate of 3 Å/min and an electron density of $3 \times 10^{17}$ cm$^{-3}$ to an Si-doped GaN barrier layer. The Si-doped GaN barrier layer was formed as follows.

The supply of TEGa and SiH$_4$ into the furnace was started while keeping the substrate temperature at 720° C., and after a thin barrier layer A comprising an Si-doped GaN was formed for a predetermined time, the supply of TEGa and SiH$_4$ was stopped. In this state, of the growth being interrupted, the susceptor temperature was elevated to 920° C. and, when the temperature was stabilized, the valves for TEGa and SiH$_4$ were switched to restart the supply of TEGa and SiH$_4$ into the furnace without changing the substrate temperature, the pressure in the furnace, and the flow rate or kind of each of the ammonia gas and the carrier gas. At the same substrate temperature of 920° C., a barrier layer B was grown for a specified time. After the growth of the barrier layer B, the supply of TEGa and SiH$_4$ into the furnace was stopped. Subsequently, the susceptor temperature was lowered to 720° C., the supply of TEGa and SiH$_4$ was started, to grow a barrier layer C, and the valves were again switched to stop the supply of TEGa and SiH$_4$, thereby completing the growth of a GaN barrier layer. In this way, an Si-doped GaN barrier layer having a three-layer structure consisting of barrier layers A, B and C and having a total thickness of 15 nm was formed.

After the growth of the GaN barrier layer, the supply of TEGa and SiH$_4$ stopped for 30 seconds. Then, after the setting of the supply amount of TEGa was changed to the amount which was previously studied, TEGa and TMIn were supplied into the furnace by switching the valves for TEGa and TMIn while the pressure in the furnace and the flow rates and kinds of ammonia gas and of the carrier gas were maintained to form a well layer. After supplying TEGa and TMIn for predetermined time, the supplies of TEGa and TMIn were stopped by switching the valves again to finish the growth of the In$_{0.08}$Ga$_{0.92}$N well layer. At that time, the In$_{0.08}$Ga$_{0.92}$N well layer having a thickness of 3 nm was formed. After the growth of the In$_{0.08}$Ga$_{0.92}$N well layer was completed, the setting of the supply amount of TEGa was changed. After that, TEGa and SiH$_4$ were supplied to form a second barrier layer.

The above described processes were repeated 5 times to form five Si-doped GaN barrier layers and five In$_{0.08}$Ga$_{0.92}$N well layers. In the manufacturing processes of the well layers and the barrier layers, after the barrier layer A was formed at 720° C., the growth of the semiconductor layer was stopped by stopping the supply of a III group material during the heating process to 920° C., in order to form the barrier layer B.

After the fifth In$_{0.08}$Ga$_{0.92}$N well layer was formed, the formation of a sixth barrier layer was subsequently started. In the formation of the sixth barrier layer, the supply of SiH$_4$ was restarted and, after forming a thin barrier layer A comprising an Si-doped GaN, the substrate temperature was elevated to 920° C. while continuing the supply of TEGa and SiH$_4$ into the furnace. At the same substrate temperature of 920° C., a barrier layer B was grown for a specified time. After the growth of the barrier layer B, the supply of TEGa and SiH$_4$ into the furnace was stopped. Subsequently, the substrate temperature was lowered to 720° C., the supply of TEGa and SiH$_4$ was started, to grow a barrier layer C, and the valves were again switched to stop the supply of TEGa and SiH$_4$, thereby completing the growth of a GaN barrier layer. In this way, an Si-doped GaN barrier layer having a three-layer structure consisting of barrier layers A, B and C and having a total thickness of 15 nm was formed.

According to the above described method, a light-emitting layer of a multiple quantum well structure containing well layers (the first to fourth layers) having non-uniform thicknesses and a well layer having a uniform thickness (the fifth layer) was formed.

On the outermost Si-doped GaN barrier layer of the light-emitting layer, an Mg-doped p-type $Al_{0.05}Ga_{0.95}N$ clad layer was formed.

After completion of the growth of the last Si-doped GaN barrier layer and stopping the supply of TEGa and $SiH_4$, the substrate temperature was elevated to 1,000° C. The carrier gas was changed to hydrogen, and the pressure inside the furnace was adjusted to 15 kPa (150 mbar). After the pressure inside the furnace became constant, sources (TMGa, TMAl, and $Cp_2Mg$) were supplied to the furnace by opening the corresponding valves. The growth was performed for about three minutes, after which supply of TEGa, TMAl and $Cp_2Mg$ was stopped, thereby terminating the growth of an Mg-doped p-type $Al_{0.05}Ga_{0.95}N$ clad layer. As a result, an Mg-doped p-type $Al_{0.05}Ga_{0.95}$ clad layer having a thickness of 16 nm was formed.

On the Mg-doped p-type $Al_{0.05}Ga_{0.95}N$ clad layer, an Mg-doped p-type GaN contact layer was formed.

After completion of the growth of the Mg-doped $Al_{0.05}Ga_{0.95}N$ clad layer and stopping supply of TMGa, TMAl, and $Cp_2Mg$, the pressure inside the furnace was adjusted to 20 kPa (200 mbar). After the pressure inside the furnace became constant, sources (TMGa, TMAl and $Cp_2Mg$) were supplied to the furnace by opening the corresponding valves. The flow rate of $Cp_2Mg$ had been predetermined in advance, and the flow was regulated so as to control the hole concentration of the Mg-doped $Al_{0.02}Ga_{0.98}N$ contact layer to $8\times10^{17}$ cm$^{-3}$. Thereafter, the growth was performed for about 12 minutes, after which supply of TMGa, TMAl and $Cp_2Mg$ was stopped, thereby terminating the growth of the Mg-doped GaN layer. As a result, the Mg-doped $Al_{0.02}Ga_{0.98}N$ contact layer was formed to a thickness of 0.2 μm.

After completion of the growth of the Mg-doped $Al_{0.02}Ga_{0.98}N$ contact layer, the electricity supply to the induction heater was stopped, and the substrate temperature was lowered to room temperature over 20 minutes. During the process of lowering the temperature, the atmosphere in the reactor furnace was formed exclusively of nitrogen. When the substrate temperature was confirmed to have been lowered to room temperature, the thus-fabricated gallium nitride-based compound semiconductor multilayer structure was removed to the atmosphere.

Through the above-described procedure, the gallium nitride-based compound semiconductor multilayer structure for producing a semiconductor light-emitting device was fabricated. Even though the Mg-doped $Al_{0.02}Ga_{0.98}N$ contact layer had not undergone annealing for activating the p-type carrier, the $Al_{0.02}Ga_{0.98}N$ contact layer exhibited p-type conductivity.

By use of the aforementioned gallium nitride-based compound semiconductor multilayer structure, a light-emitting diode, which is a type of semiconductor light-emitting device, was fabricated.

On the surface of the p-type AlGaN contact layer of the gallium nitride-based compound semiconductor multilayer structure produced, a positive electrode comprising a transparent electrode formed by stacking Au and NiO in this order from the contact layer side by a method well-known in the art and a pad electrode formed by sequentially stacking Ti, Au, Al and Au thereon was produced.

Subsequently, the aforementioned gallium nitride-based compound semiconductor multilayer structure was dry-etched so as to expose a negative electrode portion of the highly-Ge-doped n-type GaN contact layer. Ti and Al were successively formed on the exposed portion of the contact layer in this order, thereby forming a negative electrode. Through these operations, electrodes of the shape shown in FIG. 3 were fabricated.

The back of the sapphire substrate of the gallium nitride-based compound semiconductor multilayer structure which had been provided with the positive electrode and the negative electrode in the above manner was ground and polished, thereby providing a mirror surface. Subsequently, the gallium nitride-based compound semiconductor multilayer structure was cut into square (300 μm×300 μm) chips. The thus-formed chip was placed on a lead frame and wired to the lead frame with gold wire, thereby fabricating a light-emitting diode.

When an operating current was applied to the positive electrode and the negative electrode of the thus-fabricated light-emitting diode in a forward direction, the diode exhibited a forward voltage (an operating voltage) of 3.3 V at a current of 20 mA, an emission wavelength of 460 nm, and an light emission output of 5.5 mW. Such characteristics of the light-emitting diode can be attained without variation among light-emitting diodes cut and produced from virtually the entirety of the above-fabricated gallium nitride-based compound semiconductor multilayer structure.

A current of 30 mA was passed through this light-emitting diode in the forward direction and when an aging test of measuring the light emission output at the start and after 100 hours was performed and the degradation percentage of the light emission output was compared between at the start and after 100 hours, the output degradation percentage was 5% and good.

Also, the reverse voltages at the current of 10 μA before and after the power supply at the current of 30 mA and for 100 hours were measured and compared with each other. The changing rate of the reverse voltages was 0%.

Example 15

Light-emitting diodes were produced in the same manner as in Example 14 except for changing the supply amount of TEGa so that the growth rates of Si-doped GaN barrier layer A and B were 3 Å/min and the growth rate of Si-doped GaN barrier layer C was 7 Å/min, and the obtained light-emitting diode was evaluated in the same manner as in Example 14.

The diode exhibited a forward voltage (an operating voltage) of 3.3 V at a current of 20 mA, an emission wavelength of 460 nm, and a light emission output of 5.5 mW. Such characteristics of the light-emitting diode can be attained without variation among light-emitting diodes cut and produced from virtually the entirety of the above-fabricated gallium nitride-based compound semiconductor multilayer structure.

A current of 30 mA was passed through this light-emitting diode in the forward direction and when an aging test of measuring the light emission output at the start and after 100 hours was performed and the degradation percentage of the light emission output was compared between at the start and after 100 hours, the output degradation percentage was 6%.

Also, the reverse voltages at the current of 10 μA before and after the power supply at the current of 30 mA and for 100 hours were measured and compared with each other. The changing rate of the reverse voltages was 0%.

Comparative Example 9

Light-emitting diode were produced in the same manner as in Example 14 except for changing the supply amount of TEGa so that the growth rates of Si-doped GaN barrier layer A, B and C were 12 Å/min, and the obtained light-emitting diode was evaluated in the same manner as in Example 14.

The diode exhibited a forward voltage (an operating voltage) of 3.3 V at a current of 20 mA, an emission wavelength of 460 nm, and a light emission output of 5.5 mW. Such characteristics of the light-emitting diode can be attained without variation among light-emitting diodes cut and produced from virtually the entirety of the above-fabricated gallium nitride-based compound semiconductor multilayer structure.

A current of 30 mA was passed through this light-emitting diode in the forward direction and when an aging test of measuring the light emission output at the start and after 100 hours was performed and the degradation percentage of the light emission output was compared between at the start and after 100 hours, the output degradation percentage was 15%.

Also, the reverse voltages at the current of 10 μA before and after the power supply at the current of 30 mA and for 100 hours were measured and compared with each other. The changing rate of the reverse voltages was 0%.

The light-emitting device obtained by using a gallium nitride-based compound semiconductor multilayer structure produced according to the production method of the present invention is assured of low operating voltage, high light emission and reduced percentage change in the light emission output due to aging and, therefore, has a very high utility value in industry as, for example, a lamp or the like.

What is claimed is:

1. A method for producing a gallium nitride-based compound semiconductor multilayer structure comprising a substrate having thereon an n-type semiconductor layer, a light-emitting layer and a p-type semiconductor layer, the light-emitting layer being disposed between the n-type semiconductor layer and the p-type semiconductor layer, and the light-emitting layer having a multiple quantum well structure formed by alternately stacking a well layer and a barrier layer, wherein at least one well layer has a non-uniform thickness, the barrier layer is grown through three steps of a same temperature as the well layer, a higher temperature than the well layer and a same temperature as the well layer, a temperature difference (T2−T1) between a maximum growth temperature (T2) of the barrier layer and a growth temperature (T1) of the well layer is adjusted to be in a range from 160 to 200° C., and a temperature difference (T3−T1) between a growth temperature (T3) of the p-type semiconductor layer and the growth temperature (T1) of the well layer is adjusted to be in a range from 240 to 280° C.

2. The method for producing a gallium nitride-based compound semiconductor multilayer structure according to claim 1, wherein the barrier layer is grown at a growth rate of less than 10 Å/min.

3. The method for producing a gallium nitride-based compound semiconductor multilayer structure according to claim 1, wherein the temperature difference (T3−T2) between the growth temperature (T3) of the p-type semiconductor layer and the maximum growth temperature (T2) of the barrier layer is further adjusted to be in a range from 40 to 90° C.

4. The method for producing a gallium nitride-based compound semiconductor multilayer structure according to claim 1, wherein the growth temperature (T3) of the p-type semiconductor layer is adjusted to be in a range from 900 to 1,050° C.

5. The method for producing a gallium nitride-based compound semiconductor multilayer structure according to claim 1, wherein the well layer closest to the p-type semiconductor layer has a uniform thickness.

6. The method for producing a gallium nitride-based compound semiconductor multilayer structure according to claim 1, wherein the well layer closest to the n-type semiconductor layer has a uniform thickness.

7. The method for producing a gallium nitride-based compound semiconductor multilayer structure according to claim 1, wherein the thickness of a well layer having a uniform thickness is 1.8 to 5 nm.

8. The method for producing a gallium nitride-based compound semiconductor multilayer structure according to claim 1, wherein the thickness of a thin part of a well layer having a non-uniform thickness is not more than 2.7 nm.

9. The method for producing a gallium nitride-based compound semiconductor multilayer structure according to claim 1, wherein the multiple quantum well structure comprises 3 to 10 stacks of the well layer and the barrier layer.

10. The method for producing a gallium nitride-based compound semiconductor multilayer structure according to claim 1, wherein the barrier layer is a gallium nitride-based compound semiconductor selected from GaN, AlGaN and InGaN having a smaller In percentage than the InGaN forming the well layer.

11. The method for producing a gallium nitride-based compound semiconductor multilayer structure according to claim 10, wherein the barrier layer is GaN.

12. The method for producing a gallium nitride-based compound semiconductor multilayer structure according to claim 1, wherein the barrier layer contains a dopant.

13. The method for producing a gallium nitride-based compound semiconductor multilayer structure according to claim 12, wherein the dopant is at least one selected from the group consisting of C, Si, Ge, Sn, Pb, O, S, Se, Te, Po, Be, Mg, Ca, Sr, Ba and Ra.

14. The method for producing a gallium nitride-based compound semiconductor multilayer structure according to claim 12, wherein the concentration of the dopant is from $1 \times 10^{17}$ to $1 \times 10^{18}$ cm$^{-3}$.

15. The method for producing a gallium nitride-based compound semiconductor multilayer structure according to claim 1, wherein the thickness of the barrier layer is from 7 to 50 nm.

16. The method for producing a gallium nitride-based compound semiconductor multilayer structure according to claim 15, wherein the thickness of the barrier layer is at least 14 nm.

17. The method for producing a gallium nitride-based compound semiconductor multilayer structure according to claim 1, wherein the well layer comprises In.

18. The method for producing a gallium nitride-based compound semiconductor multilayer structure according to claim 17, wherein a thin layer containing no In is provided on at least the substrate side of the barrier layer.

19. The method for producing a gallium nitride-based compound semiconductor multilayer structure according to claim 1, wherein after a well layer is formed, the layer thus formed is partly decomposed or sublimated to provide a non-uniform thickness.

20. The method for producing a gallium nitride-based compound semiconductor multilayer structure according to claim 19, wherein the substrate temperature during decomposing or sublimating a part of the well layer is not lower than the substrate temperature during the forming of the well layer.

21. The method for producing a gallium nitride-based compound semiconductor multilayer structure according to claim 19, wherein the decomposition or sublimation of a part of the well layer is conducted in an atmosphere containing a nitrogen source and containing no group III metal source.

22. The method for producing a gallium nitride-based compound semiconductor multilayer structure according to claim 19, wherein the decomposition or sublimation of a part of the well layer is conducted during forming the barrier layer.

23. A gallium nitride-based compound semiconductor multilayer structure produced by the production method according to claim 1.

24. A gallium nitride-based compound semiconductor light-emitting device fabricated by providing a negative electrode and a positive electrode on the n-type semiconductor layer and the p-type semiconductor layer of the gallium nitride-based compound semiconductor multilayer structure according to claim 23, respectively.

25. A lamp comprising the gallium nitride-based compound semiconductor light-emitting device according to claim 24.

26. An electronic machine incorporating the lamp according to claim 25.

27. A machine incorporating the electronic machine according to claim 26.

* * * * *